United States Patent
Nam et al.

(10) Patent No.: US 12,484,345 B2
(45) Date of Patent: Nov. 25, 2025

(54) DISPLAY DEVICE

(71) Applicant: Samsung Display Co., LTD., Yongin-si (KR)

(72) Inventors: Yuk Hyun Nam, Yongin-si (KR); Hang Jae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 18/075,504

(22) Filed: Dec. 6, 2022

(65) Prior Publication Data
US 2023/0352626 A1 Nov. 2, 2023

(30) Foreign Application Priority Data
May 2, 2022 (KR) .................. 10-2022-0054164

(51) Int. Cl.
*H10H 20/831* (2025.01)
*H01L 25/075* (2006.01)
*H10H 20/857* (2025.01)

(52) U.S. Cl.
CPC ..... *H10H 20/8312* (2025.01); *H01L 25/0753* (2013.01); *H10H 20/857* (2025.01)

(58) Field of Classification Search
CPC .......... H10H 20/8312; H10H 20/8316; H10H 20/857; H01L 25/167; H10K 59/122; H10K 59/173
See application file for complete search history.

(56) References Cited

U.S. PATENT DOCUMENTS

2021/0367024 A1* 11/2021 Kim .................. H10K 59/131
2023/0207734 A1* 6/2023 Lee .................. H10H 20/857
257/79

FOREIGN PATENT DOCUMENTS

KR 10-2021-0098313 8/2021
WO 2020/013386 1/2020

* cited by examiner

*Primary Examiner* — Joshua Benitez Rosario
*Assistant Examiner* — Jacob T Nelson
(74) *Attorney, Agent, or Firm* — Womble Bond Dickinson (US) LLP

(57) ABSTRACT

A display device comprises a bank pattern disposed on a substrate and including a first bank pattern extended in a direction, second bank patterns adjacent to each other with the first bank pattern disposed between the second bank patterns, and connection portions connecting the first bank pattern with the second bank patterns, a first electrode disposed on the first bank pattern, a second electrode disposed on one of the second bank patterns, and a third electrode disposed on another one of the second bank patterns, an insulating layer disposed on the bank pattern, the first electrode, the second electrode, and the third electrode, and light emitting elements disposed between the first electrode and the second electrode, and between the first electrode and the third electrode.

20 Claims, 19 Drawing Sheets

RME: RME1, RME2, RME3
CNE: CNE1, CNE2, CNE3, CNE4, CNE5
ED: ED1, ED2, ED3, ED4
SA: SA1, SA2

DISPLAY DEVICE

CROSS REFERENCE TO RELATED APPLICATION(S)

This application claims priority to and benefits of Korean Patent Application No. 10-2022-0054164 under 35 U.S.C. § 119, filed on May 2, 2022, in the Korean Intellectual Property Office (KIPO), the entire contents of which are incorporated herein by reference.

BACKGROUND

1. Technical Field

The disclosure relates to a display device.

2. Description of the Related Art

With the advancement of multimedia, importance of a display device has been enhanced. Accordingly, various types of display devices such as organic light emitting display (OLED) device and liquid crystal display (LCD) device have been used.

The display device includes a display panel such as an organic light emitting display panel or a liquid crystal display panel to display an image. The light emitting display panel may include a light emitting element, for example, a light emitting diode (LED). Examples of the light emitting diode include an organic light emitting diode (OLED) that uses an organic material as a light emitting material, and an inorganic light emitting diode that uses an inorganic material as a light emitting material.

SUMMARY

An object of the disclosure is to provide a display device. The display device may improve luminance of a subpixel by minimizing light emitting elements seated on a non-light emission area in the subpixel.

The objects of the disclosure are not limited to those mentioned above and additional objects of the disclosure, which are not mentioned herein, will be clearly understood by those skilled in the art from the following description of the disclosure.

According to an embodiment of the disclosure, a display device may comprise a bank pattern disposed on a substrate and including a first bank pattern extended in a direction, second bank patterns adjacent to each other with the first bank pattern disposed between the second bank patterns, and connection portions connecting the first bank pattern with the second bank patterns, a first electrode disposed on the first bank pattern, a second electrode disposed on one of the second bank patterns, a third electrode disposed on another one of the second bank patterns, an insulating layer disposed on the bank pattern, the first electrode, the second electrode, and the third electrode, and light emitting elements disposed between the first electrode and the second electrode, and between the first electrode and the third electrode, wherein at least one of the first electrode, the second electrode, and the third electrode includes a protrusion protruded toward an adjacent one of the first electrode, the second electrode, and the third electrode in a plan view, and the insulating layer includes an opening exposing the protrusion.

In an embodiment, the connection portions may be extended in another direction intersecting the direction, and the connection portions may be integral with the first bank pattern and the second bank patterns.

In an embodiment, the connection portions may include a first connection portion connecting one of the second bank patterns disposed at a side of the first bank pattern with the first bank pattern, and a second connection portion connecting another one of the second bank patterns disposed at another side of the first bank pattern with the first bank pattern.

In an embodiment, the first connection portion and the second connection portion may be spaced apart from each other with the first bank pattern disposed between the first connection portion and the second connection portion, and the first connection portion and the second connection portion may be aligned with each other in another direction intersecting the direction.

In an embodiment, the protrusion may include a first protrusion protruded from the second electrode toward the first electrode, and a second protrusion protruded from the third electrode toward the first electrode.

In an embodiment, the first protrusion may overlap the first connection portion in a plan view, and the second protrusion may overlap the second connection portion in a plan view.

In an embodiment, the first electrode may include concave portions, and the concave portions may include a first concave portion corresponding to the first protrusion, and a second concave portion corresponding to the second protrusion.

In an embodiment, an end of the first protrusion may be disposed in the first concave portion in a plan view, and an end of the second protrusion may be disposed in the second concave portion in a plan view.

In an embodiment, the protrusion may include a first protrusion protruded from the first electrode toward the second electrode, and a second protrusion protruded from the third electrode toward the first electrode.

In an embodiment, the first electrode may include a first concave portion, the first concave portion may correspond to the second protrusion, and an end of the second protrusion may be disposed in the first concave portion in a plan view.

In an embodiment, the protrusion may include a first protrusion protruded from the first electrode toward the third electrode, and a second protrusion protruded from the second electrode toward the first electrode.

In an embodiment, the first electrode may include a first concave portion, the first concave portion may correspond to the second protrusion, and an end of the second protrusion may be disposed in the first concave portion in a plan view.

In an embodiment, the protrusion may include a first protrusion protruded from the first electrode toward the second electrode, and a second protrusion protruded from the first electrode toward the third electrode.

According to an embodiment of the disclosure, a display device may comprise a bank pattern disposed on a substrate and including a first bank pattern extended in a direction, and second bank patterns adjacent to each other with the first bank pattern disposed between the second bank patterns, a first electrode disposed on the first bank pattern, a second electrode disposed on one of the second bank patterns, and a third electrode disposed on another one of the second bank patterns, an insulating layer disposed on the bank pattern, the first electrode, the second electrode, and the third electrode, light emitting elements disposed between the first electrode and the second electrode, and between the first electrode and the third electrode, and a via layer disposed between the substrate and the bank pattern and including a via protrusion protruded through the insulating layer, wherein at least one of the first electrode, the second electrode, and the third electrode includes a protrusion protruded toward an adjacent one of the first electrode, the second electrode, and the third electrode in a plan view, and the insulating layer includes an opening exposing the protrusion.

In an embodiment, the via protrusion may be extended in another direction intersecting the direction, and the via protrusion may be integral with the via layer.

In an embodiment, the via protrusion may overlap the protrusion in a plan view, and the via protrusion and the protrusion may be extended to be parallel with each other.

In an embodiment, the first electrode may include a concave portion in an area corresponding to the protrusion, and the opening may overlap the concave portion, the protrusion, and the via protrusion in a plan view.

In an embodiment, an upper surface of the insulating layer may be aligned with and matched with upper surfaces of the second electrode and the third electrode in the opening.

In an embodiment, the display device may further comprise a bank layer disposed on the insulating layer, partitioning a light emission area, wherein the via protrusion, the protrusion, and the opening are disposed in the light emission area.

In an embodiment, the light emitting elements may include a first light emitting element and a second light emitting element which are disposed between the first electrode and the second electrode, a third light emitting element and a fourth light emitting element which are disposed between the first electrode and the third electrode, and the display device may further include a first connection electrode electrically contacting an end of the first light emitting element, a second connection electrode electrically contacting another end of the first light emitting element and an end of the second light emitting element, a third connection electrode electrically contacting another end of the second light emitting element and an end of the third light emitting element, a fourth connection electrode electrically contacting another end of the third light emitting element and an end of the fourth light emitting element, and a fifth connection electrode electrically contacting another end of the fourth light emitting element.

In the display device according to the embodiments, ink may be guided so as not to be coated on a center of a light emission area, so that the number of light emitting elements for not emitting light may be reduced. Therefore, effective light emitting elements may be increased to improve luminance of a subpixel.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
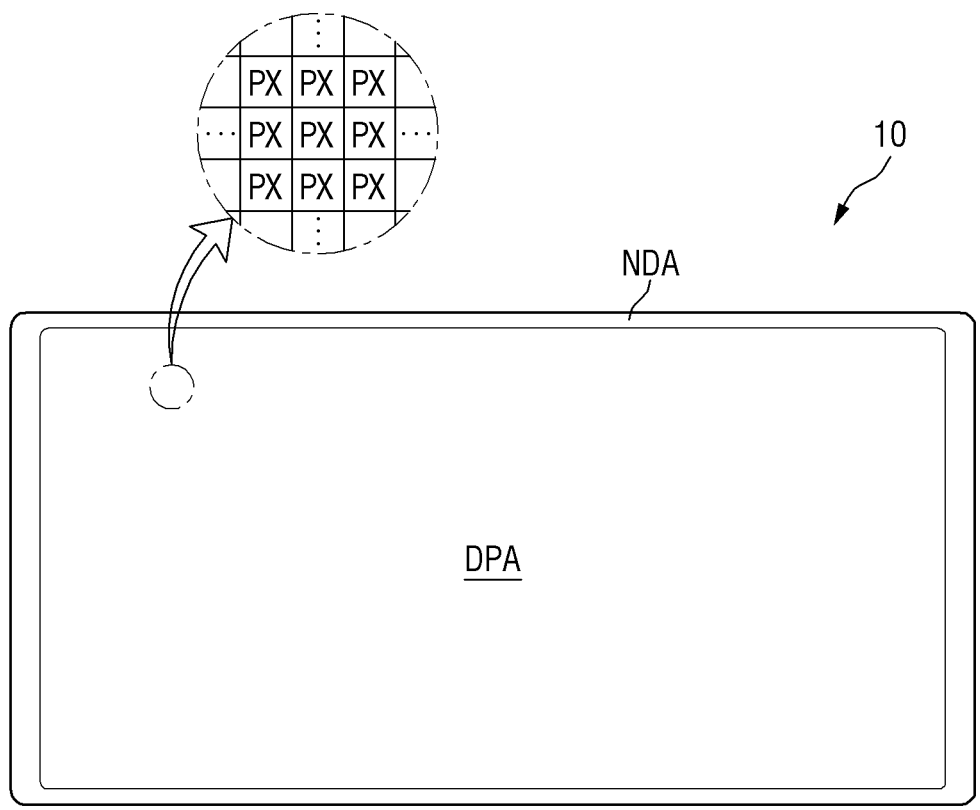
FIG. 1 is a schematic plan view illustrating a display device according to an embodiment.
Figure 1:
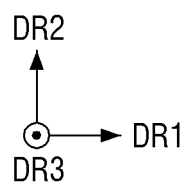

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

If a first object "overlaps" a second object, at least part of the first object may face at least part of the second object in a direction or view.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, detailed embodiments of the disclosure will be described with reference to the accompanying drawings.

FIG. 1 is a schematic plan view illustrating a display device according to an embodiment.

Referring to FIG. 1, the display device 10 may display a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder, or the like may be included in the display device 10.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, an inorganic light emitting diode display panel may be applied as an example of a display panel, but is not limited thereto. Another display panel may be used in case that a same technical spirits are applicable thereto.

In the drawing in which the display device 10 is illustrated, a first direction DR1, a second direction DR2, and a third direction DR3 may be defined. The first direction DR1 and the second direction DR2 may be directions perpendicular to each other in a plane. The third direction DR3 may be a direction perpendicular to the plane on which the first direction DR1 and the second direction DR2 are positioned. The third direction DR3 may be perpendicular to each of the first direction DR1 and the second direction DR2. In the embodiment in which the display device 10 is described, the third direction DR3 may refer to a thickness direction of the display device 10.

Various modifications may be made in a shape of the display device 10. For example, the display device 10 may have a rectangular shape that includes a long side longer in the first direction DR1 than the second direction DR2 on the plane. As another example, the display device 10 may have a rectangular shape that includes a long side longer in the second direction DR2 than the first direction DR1 on the plane. However, the disclosure is not limited to these examples, and the display device 10 may have a square shape, a square shape with rounded corners (vertices), other polygonal shape, a circular shape, or the like. A shape of a display area DPA of the display device 10 may be also substantially identical or similar to the overall shape of the display device 10. In FIG. 1, a rectangular display device 10 and a rectangular display area DPA, which are longer in the first direction DR1 than the second direction DR2, may be illustrated.

The display device 10 may include a display area DPA and a non-display area NDA. The display area DPA may be an area in which an image is displayed, and the non-display area NDA may be an area in which an image is not displayed. The display area DPA may be referred to as an active area, and the non-display area NDA may be referred to as a non-active area. The display area DPA may generally occupy a center of the display device 10.

The display area DPA may include pixels PX. The pixels PX may be arranged in a matrix direction. A shape of each pixel PX may be a rectangular or square shape on a plane, but is not limited thereto. The shape of each pixel PX may be a rhombus shape in which each side is inclined with respect to a direction. The corresponding pixels PX may be alternately arranged in a stripe type or a PENTILE™ type. Each of the pixels PX may include one or more light emitting elements for emitting light of a specific wavelength band to display a specific color.

The non-display area NDA may be disposed in the vicinity of the display area DPA. The non-display area NDA may fully or at least partially surround the display area DPA. The display area DPA may be rectangular in shape, and the non-display area NDA may be disposed to be adjacent to four sides of the display area DPA. The non-display area NDA may constitute a bezel of the display device 10. Lines or circuit drivers included in the display device 10 may be disposed in the non-display areas NDA, or external devices may be packaged therein.

Figure 2:
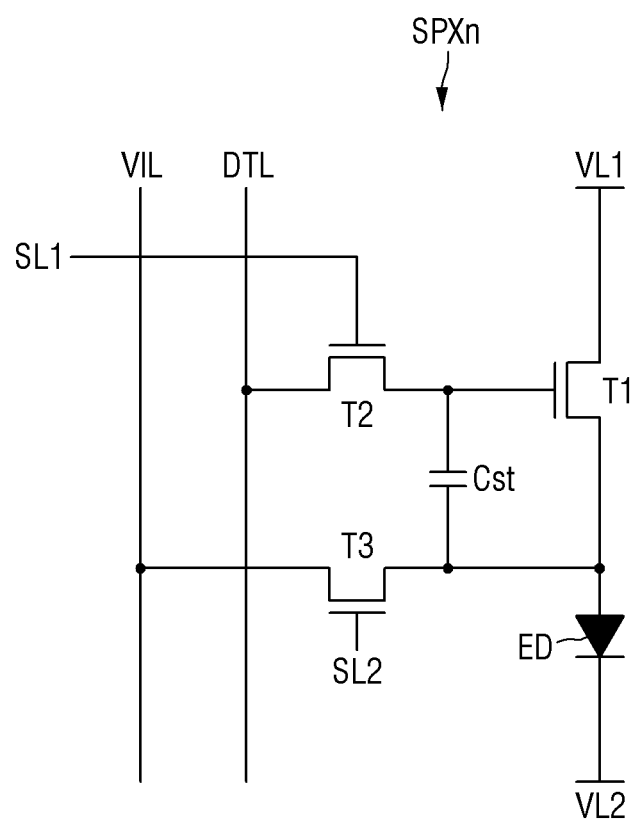
FIG. 2 is a schematic diagram of an equivalent circuit illustrating a subpixel of a display device according to an embodiment.

FIG. 2 is a schematic diagram of an equivalent circuit illustrating a subpixel of a display device according to an embodiment.

Referring to FIG. 2, each subpixel SPXn of the display device 10 according to an embodiment may include three transistors T1, T2, and T3 and one storage capacitor Cst in addition to a light emitting element ED.

The light emitting element ED may emit light in accordance with a current supplied through the first transistor T1. The light emitting element ED may emit light of a specific wavelength band by an electrical signal transferred from a first electrode and a second electrode, which are connected to ends.

An end of the light emitting element ED may be connected to a source electrode of the first transistor T1, and another end thereof may be connected to a second voltage line VL2 to which a low potential voltage (hereinafter, referred to as "second power voltage") lower than a high potential voltage (hereinafter, referred to as "first power voltage") of a first voltage line VL1 is supplied.

The first transistor T1 may adjust the current flowing from the first voltage line VL1, to which the first power voltage is supplied, to the light emitting element ED in accordance with a voltage difference between a gate electrode and a source electrode. For example, the first transistor T1 may be a driving transistor for driving the light emitting element ED. The gate electrode of the first transistor T1 may be connected to a source electrode of the second transistor T2, and the source electrode thereof may be connected to an end of the light emitting element ED. A drain electrode of the first transistor T1 may be connected to the first voltage line VL1 to which the first power voltage is applied.

The second transistor T2 may be turned on by a scan signal of a first scan line SL1 to connect a data line DTL to the gate electrode of the first transistor T1. A gate electrode of the second transistor T2 may be connected to the first scan line SL1, the source electrode thereof may be connected to the gate electrode of the first transistor T1, and a drain electrode thereof may be connected to the data line DTL.

The third transistor T3 may be turned on by a scan signal of a second scan line SL2 to connect an initialization voltage line VIL to an end of the light emitting element ED. A gate electrode of the third transistor T3 may be connected to the second scan line SL2, a drain electrode thereof may be connected to the initialization voltage line VIL, and a source electrode thereof may be connected to an end of the light emitting element ED or the source electrode of the first transistor T1. The first scan line SL1 and the second scan line SL2 may be shown as being distinguished from each other, but are not limited thereto. In some embodiments, the first scan line SL1 and the second scan line SL2 may be formed of a line, and the second transistor T2 and the third transistor T3 may be simultaneously turned on by a same scan signal.

In an embodiment, the source electrode and the drain electrode of each of the transistors T1, T2, and T3 are not limited to those described above, and vice versa. Each of the transistors T1, T2, and T3 may be formed of a thin film transistor. In FIG. 2, each of the transistors T1, T2, and T3 may be formed of an N-type metal oxide semiconductor field effect transistor (MOSFET), but is not limited thereto. For example, each of the transistors T1, T2, and T3 may be formed of a P-type MOSFET, or a portion of the transistors T1, T2, and T3 may be an N-type MOSFET, and the other portion thereof may be formed of a P-type MOSFET.

The storage capacitor Cst may be formed between the gate electrode and the source electrode of the first transistor T1. The storage capacitor Cst may store a differential voltage between a gate voltage of the first transistor TI and a source voltage of the first transistor T1.

Hereinafter, a structure of a subpixel SPXn of the display device 10 according to an embodiment will be described in detail with reference to other drawings.

Figure 3:
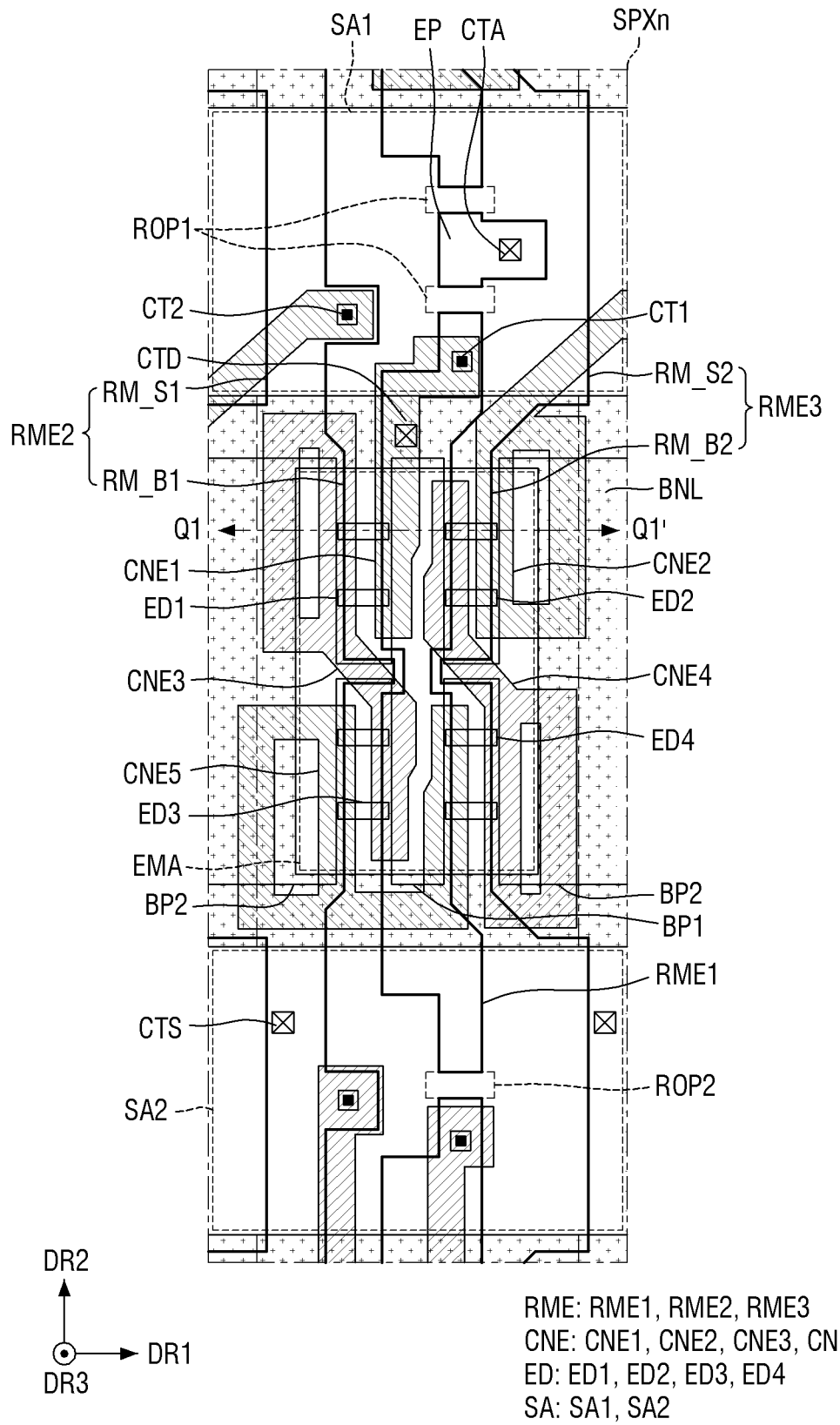
FIG. 3 is a schematic plan view illustrating a subpixel of a display device according to an embodiment.
Figure 4:
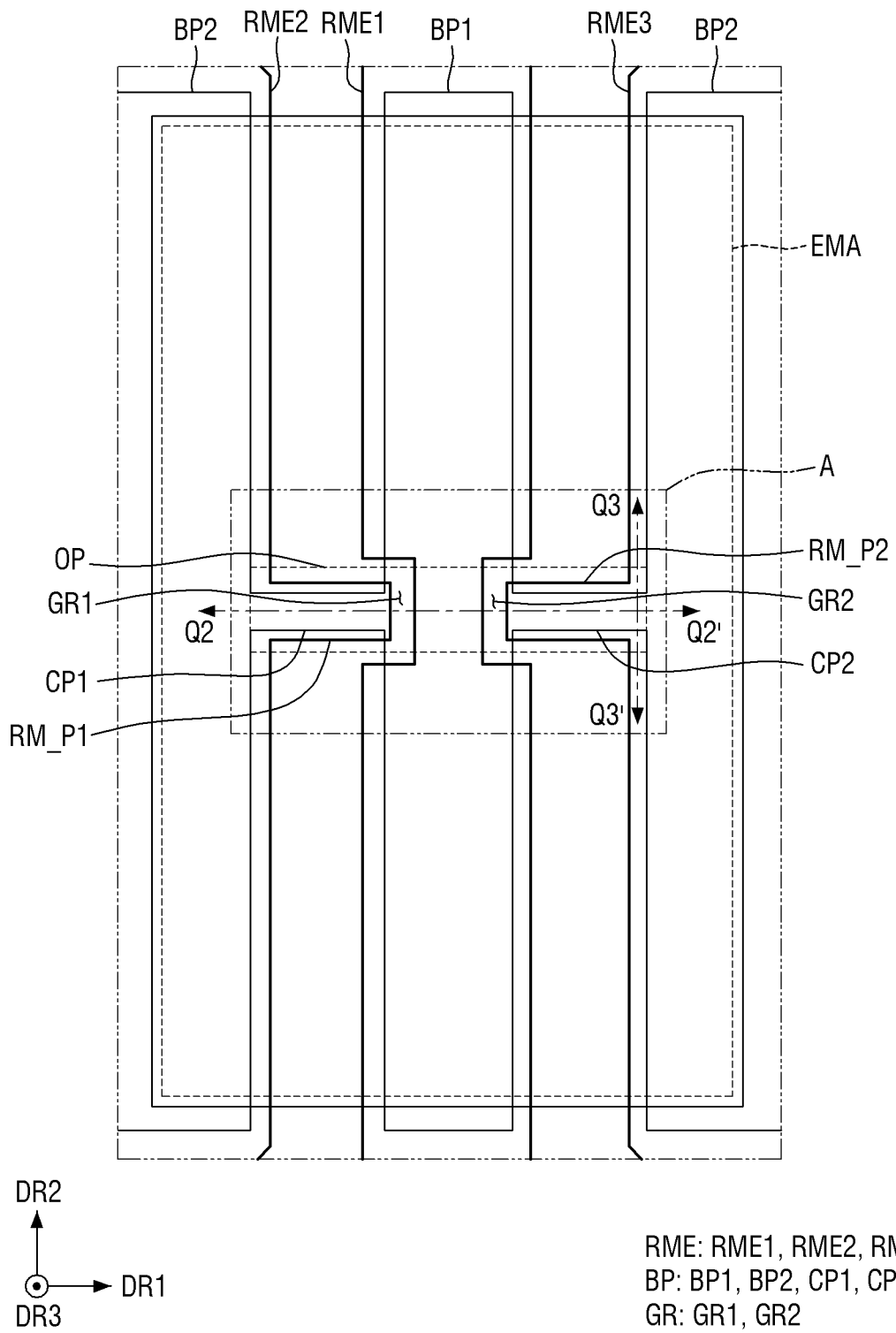
FIG. 4 is a schematic plan view illustrating electrodes and a bank pattern of a subpixel.
Figure 5:
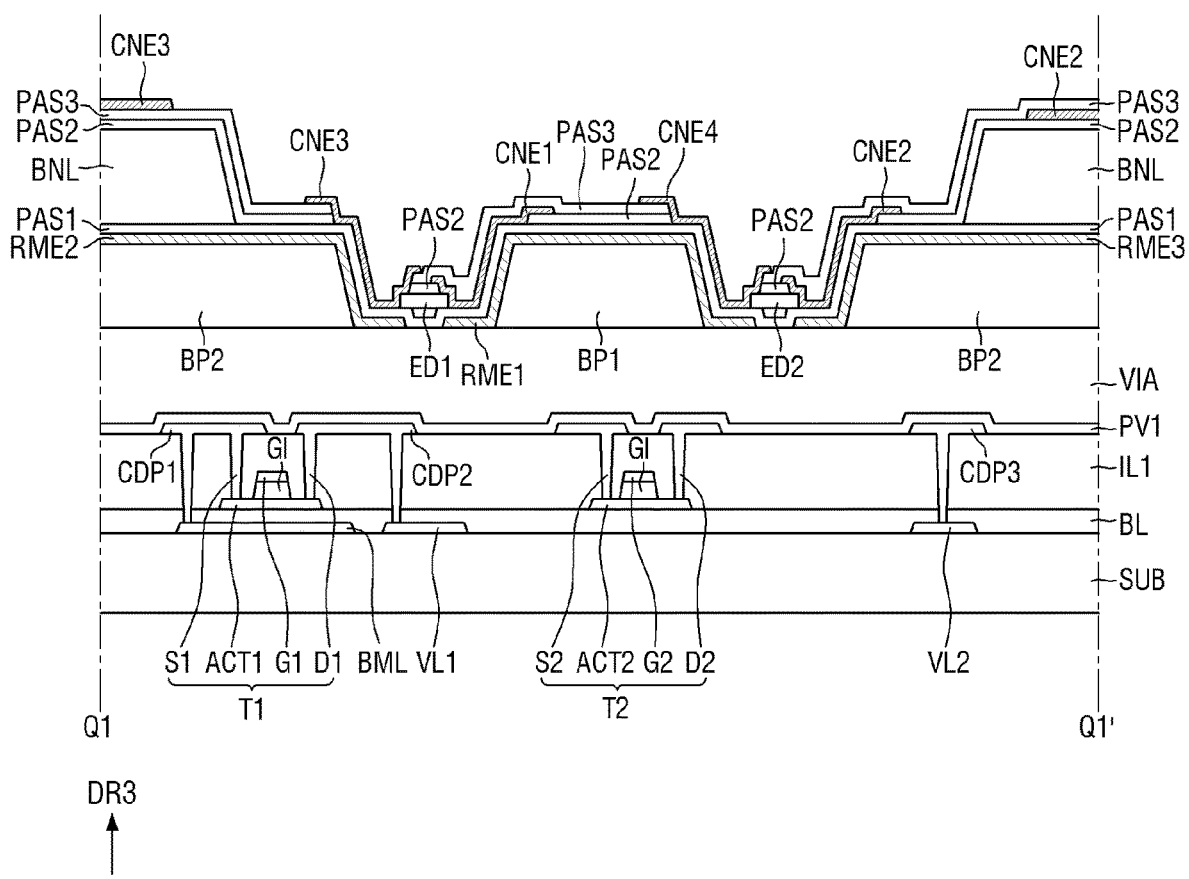
FIG. 5 is a schematic cross-sectional view taken along line Q1-Q1' of FIG. 3.
Figure 6:
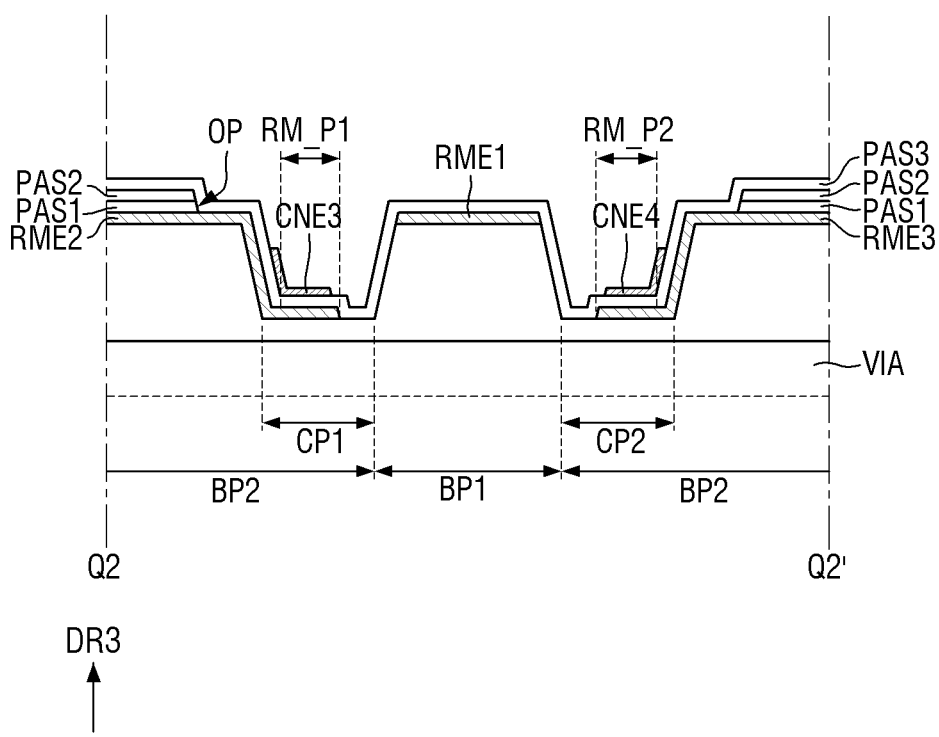
FIG. 6 is a schematic cross-sectional view taken along line Q2-Q2' of FIG. 4.
Figure 7:
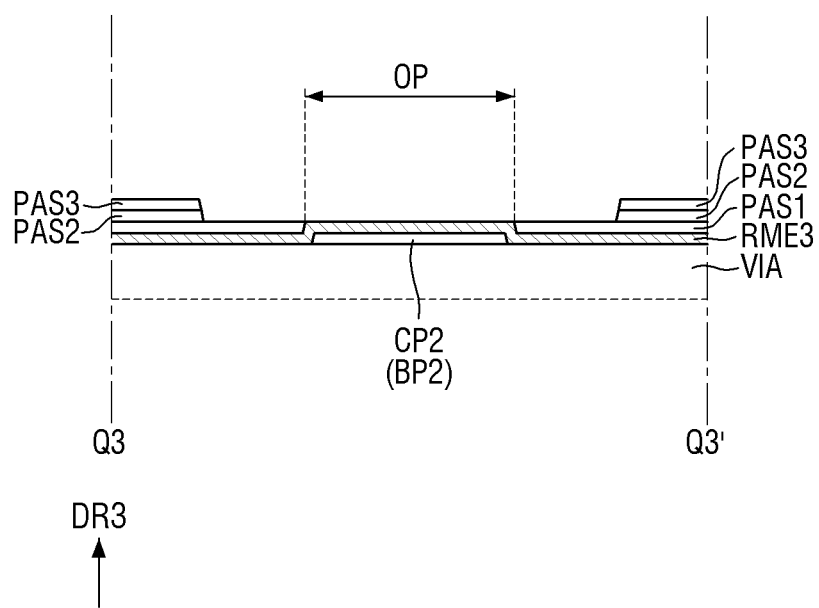
FIG. 7 is a schematic cross-sectional view taken along line Q3-Q3' of FIG. 4.

FIG. 3 is a schematic plan view illustrating a subpixel of a display device according to an embodiment. FIG. 4 is a schematic plan view illustrating electrodes and a bank pattern of a subpixel. FIG. 5 is a schematic cross-sectional view taken along line Q1-Q1' of FIG. 3. FIG. 6 is a schematic cross-sectional view taken along line Q2-Q2' of FIG. 4. FIG. 7 is a schematic cross-sectional view taken along line Q3-Q3' of FIG. 4.

Referring to FIGS. 3 to 7, each of pixels PX of the display device 10 may include subpixels SPXn (e.g., n is an integer of 1 to 3, but the embodiments are not limited thereto). For example, a pixel PX may include three subpixels SPXn, wherein a first subpixel may emit light of a first color, a second subpixel may emit light of a second color, and a third subpixel may emit light of a third color. For example, the first color may be red, the second color may be green, and the third color may be blue. However, without limitation to this example, the corresponding subpixels SPXn may emit light of a same color. In another embodiment, the corresponding subpixels SPXn may emit light of a blue color. Also, the pixel PX may include a larger number of subpixels SPXn.

Each of the subpixels SPXn of the display device 10 may include a light emission area EMA and a non-light emission area. The light emission area EMA may be an area in which light emitting elements ED: ED1, ED2, ED3, and ED4 are disposed so that light of a specific wavelength band is emitted. The non-light emission area may be an area in which the light emitting elements ED are not disposed and light emitted from the light emitting elements ED does not reach there so that the light is not emitted. The light emission area EMA may include an area in which the light emitting elements ED are disposed, and thus may include an area in which light emitted from the light emitting elements ED is emitted to an area adjacent to the light emitting elements ED.

Without limitation to this embodiment, the light emission area EMA may also include an area in which light emitted from the light emitting elements ED is reflected or refracted by another member. The light emitting elements ED may be disposed in each subpixel SPXn, and the area in which the light emitting elements ED are disposed and its adjacent area may form the light emission area EMA.

The light emission areas EMA of the subpixels SPXn may have a substantially uniform size, but are not limited thereto. In some embodiments, the light emission areas EMA of the subpixels SPXn may have their sizes different from each other depending on a color or wavelength band of light emitted from the light emitting element ED disposed in the corresponding subpixel SPXn.

Each subpixel SPXn may further include sub-areas SA: SA1 and SA2 disposed in the non-light emission area. The sub-areas SA may be disposed in the second direction DR2 of the light emission area EMA and an opposite direction of the second direction DR2. The sub-areas SA may be disposed between the light emission areas EMA of the subpixels SPXn, which are adjacent to each other in the second direction DR2 and the opposite direction of the second direction DR2. For example, the subpixels SPXn may be disposed such that the first sub-area SA1 and the second sub-area SA2 are spaced apart from each other in the second direction DR2 with the light emission areas EMA interposed (or disposed) therebetween, but are not limited thereto. The light emission areas EMA and the sub-areas SA may have an arrangement different from that of FIG. 3.

A bank layer BNL may be disposed between the sub-areas SA and the light emission areas EMA, and an interval between the sub-areas SA and the light emission areas EMA may vary depending on a width of the bank layer BNL. Since the light emitting element ED is not disposed in the sub-area SA, light may be not emitted from the sub-area SA but a portion of electrodes RME: RME1, RME2 and RME3 disposed in each subpixel SPXn may be disposed in the sub-area SA. The electrodes RME disposed in different subpixels SPXn may be disposed to be spaced apart from each other by a first partition portion ROP1 of the first sub-area SA1 and a second partition portion ROP2 of the second sub-area SA2.

The bank layer BNL may include a portion extended in the first direction DR1 and the second direction DR2 on a plane, and thus may be disposed on a surface (or front or upper surface) of the display area DPA in a lattice pattern. The bank layer BNL may be disposed over a boundary of the subpixels SPXn to distinguish the subpixels SPXn adjacent to each other. The bank layer BNL may be disposed to surround the light emission area EMA disposed for each subpixel SPXn, thereby distinguishing the light emission areas EMA.

The display device 10 may include electrodes RME, bank patterns BP, light emitting elements ED: ED1, ED2, ED3, and ED4, and connection electrodes CNE: CNE1, CNE2, CNE3, CNE4, and CNE5. These elements will be described with reference to the drawings.

The display device 10 may include a substrate SUB, and a semiconductor layer, conductive layers, and insulating layers, which are disposed on the substrate SUB. The semiconductor layer, the conductive layers, and the insulating layers may constitute (or form) a circuit layer and a display element layer of the display device 10.

In detail, the substrate SUB may be an insulating substrate. The substrate SUB may be made of (or include) an insulating material such as glass, quartz, polymer resin, the like, or a combination thereof. Also, the substrate SUB may be a rigid substrate, but may be a flexible substrate capable of being subjected to bending, folding, rolling, or the like. The substrate SUB may include a display area DPA and a non-display area NDA surrounding the display area DPA, and the display area DPA may include a light emission area EMA and sub-areas SA that are portions of the non-light emission area.

A first conductive layer may be disposed on the substrate SUB. The first conductive layer may include a lower metal layer BML, a first voltage line VL1, and a second voltage line VL2. The lower metal layer BML may be disposed to overlap a first active layer ACT1 of a first transistor T1. The lower metal layer BML, may prevent light from entering the first active layer ACT1 of the first transistor T1, or may be electrically connected to the first active layer ACT1 to stabilize electrical characteristics of the first transistor T1. However, the lower metal layer BML may be omitted.

A high potential voltage (or first power voltage) transferred to the first electrode RME1 may be applied to the first voltage line VL1, and a low potential voltage (or second power voltage) transferred to the second electrode RME2 may be applied to the second voltage line VL2. The first voltage line VL1 may be electrically connected with the first transistor T1 through a conductive pattern (for example, second conductive pattern CDP2) of a second conductive layer. The second voltage line VL2 may be electrically connected with the second electrode RME2 through a conductive pattern (for example, third conductive pattern CDP3) of a third conductive layer.

The first voltage line VL1 and the second voltage line VL2 are illustrated as being disposed on the first conductive layer, but are not limited thereto. In some embodiments, the first voltage line VL1 and the second voltage line VL2 may be disposed on the third conductive layer, and directly and/or electrically connected to the first transistor T1 and the second electrode RME2, respectively.

A buffer layer BL may be disposed on the first conductive layer and the substrate SUB. The buffer layer BL may be formed on the substrate SUB to protect the transistors of the pixel PX from moisture permeated through the substrate SUB vulnerable to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. Each of the first active layer ACT1 and the second active layer ACT2 may be disposed to at least partially overlap a first gate electrode G1 and a second gate electrode G2 of the second conductive layer, which will be described below.

The semiconductor layer may include polycrystalline silicon, monocrystalline silicon, an oxide semiconductor, or the like. In an embodiment, the semiconductor layer may include polycrystalline silicon, or an oxide semiconductor. The oxide semiconductor may include indium (In). For example, the oxide semiconductor may be at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), and Indium Gallium Zinc Tin Oxide (IGZTO). However, the embodiments are not limited thereto.

Although the first transistor T1 and the second transistor T2 are illustrated as being disposed in the subpixel SPXn of the display device 10, the disclosure is not limited thereto. The display device 10 may include a larger number of transistors.

A gate insulating layer GI may be disposed on the semiconductor layer. The gate insulating layer GI may serve as a gate insulating layer of each of the transistors T1 and T2. The gate insulating layer GI is illustrated as being patterned along with the gate electrodes G1 and G2 of the second conductive layer, so that the gate insulating layer GI is partially disposed between the second conductive layer and the active layers ACT1 and ACT2 of the semiconductor layer, but is not limited thereto. In some embodiments, the gate insulating layer GI may be disposed entirely on the buffer layer BL while covering the semiconductor layer.

The second conductive layer may be disposed on the gate insulating layer GI. The second conductive layer may include a first gate electrode G1 of the first transistor T1 and a second gate electrode G2 of the second transistor T2. The first gate electrode G1 may be disposed to overlap a channel area of the first active layer ACT1 in a third direction DR3 that is a thickness direction, and the second gate electrode G2 may be disposed to overlap a channel area of the second active layer ACT2 in the third direction DR3 that is the thickness direction. Although not shown, the second conductive layer may further include an electrode of a storage capacitor.

An interlayer insulating layer IL1 may be disposed on the second conductive layer. The interlayer insulating layer IL1 may serve as an insulating layer between the second conductive layer and other layers disposed on the second conductive layer, and may protect the second conductive layer.

The third conductive layer may be disposed on the interlayer insulating layer IL1. The third conductive layer may include conductive patterns CDP1, CDP2, and CDP3 and source electrodes S1 and S2 and drain electrodes D1 and D2 of the respective transistors T1 and T2. A portion of the conductive patterns CDP1, CDP2, and CDP3 may electrically connect semiconductor layers and/or conductive layers of different layers with each other, and may serve as source/drain electrodes of the transistors T1 and T2.

The first conductive pattern CDP1 may contact the first active layer ACT1 of the first transistor T1 through a contact hole that passes through the interlayer insulating layer IL1. The first conductive pattern CDP1 may contact the lower metal layer BML, through another contact hole that passes through the interlayer insulating layer IL1 and the buffer layer BL. The first conductive pattern CDP1 may serve as the first source electrode S1 of the first transistor T1. In an embodiment, the first conductive pattern CDP1 may be connected to the first electrode RME1 or the first connection electrode CNE1. The first transistor T1 may transfer the first power voltage applied from the first voltage line VL1 to the first electrode RME1 or the first connection electrode CNE1.

The second conductive pattern CDP2 may contact the first voltage line VL1 through a contact hole that passes through the interlayer insulating layer IL1 and the buffer layer BL. Also, the second conductive pattern CDP2 may contact the first active layer ACT1 of the first transistor T1 through the contact hole that passes through the interlayer insulating layer IL1. The second conductive pattern CDP2 may electrically connect the first voltage line VL1 with the first transistor T1, and may serve as the first drain electrode D1 of the first transistor T1.

The second voltage line VL2 may transfer the second power voltage to the second connection electrode CNE2 through the third conductive pattern CDP3. The third conductive pattern CDP3 may contact the second voltage line VL2 through a contact hole that passes through the interlayer insulating layer IL1 and the buffer layer BL.

Each of the second source electrode S2 and the second drain electrode D2 may contact the second active layer ACT2 of the second transistor T2 through a contact hole that passes through the interlayer insulating layer IL1.

A passivation layer PV1 may be disposed on the third conductive layer. The passivation layer PV1 may serve as an insulating layer between the third conductive layer and other layers, and may protect the third conductive layer.

The buffer layer BL, the gate insulating layer GI, the interlayer insulating layer IL1, and the passivation layer PV1 may be formed of inorganic layers that are alternately stacked with each other. For example, the buffer layer BL, the gate insulating layer GI, the interlayer insulating layer IL1, and the passivation layer PV1 may be formed of a double layer in which inorganic layers including at least one of silicon oxide ($SiO_x$), silicon nitride ($SiN_x$), and silicon oxynitride ($SiO_xN_y$) are stacked with each other, or multiple layers in which the inorganic layers are alternately stacked with each other, but are not limited thereto. The buffer layer BL, the gate insulating layer GI, the interlayer insulating layer IL1, and the passivation layer PV1 may be made of one inorganic layer including insulating material described above. Also, in some embodiments, the interlayer insulating layer IL1 may be made of an organic insulating material such as polyimide (PI).

The second conductive layer and the third conductive layer may be formed of a single layer or multiple layers made of at least one of molybdenum (Mo), aluminum (Al), chromium (Cr), gold (Au), titanium (Ti), nickel (Ni), neodymium (Nd), copper (Cu), and their alloy, but are not limited thereto.

A via layer VIA may be disposed on the passivation layer PV1 in the display area DPA. The via layer VIA may include an organic insulating material such as polyimide (PI) to form a flat upper surface while compensating for a step difference caused by the conductive layers therebelow. However, in some embodiments, the via layer VIA may be omitted.

The display device 10 may include a bank pattern BP, electrodes RME, a bank layer BNL, light emitting elements ED, and connection electrodes CNE as display element layers disposed on the via layer VIA. The display device 10 may include insulating layers PAS1, PAS2, and PAS3.

The bank pattern BP may be disposed directly on the via layer VIA. The bank pattern BP may include a first bank pattern BP1 and a second bank pattern BP2. The second bank pattern BP2 may be disposed over the subpixels SPXn adjacent to each other in the first direction DR1. For example, the bank pattern BP may include a first bank pattern BP1 disposed in each of the subpixels SPXn, and a second bank pattern BP2 disposed over different subpixels SPXn.

The first bank pattern BP1 may be disposed in the light emission area EMA of the subpixel SPXn, and may have a shape extended in the second direction DR2. The first bank pattern BP1 may be disposed between the second bank pattern BP2 and the second bank pattern BP2, and spaced apart from the second bank patterns BP2. The first bank pattern BP1 may form an island-shaped pattern extended in the second direction DR2 while having a narrow width in the light emission area EMA of each subpixel SPXn on a surface of the display area DPA.

The second bank patterns BP2 may be disposed over the light emission area EMA and the non-light emission area of the subpixel SPXn. The second bank patterns BP2 may have a shape extended in the second direction DR2, and may be spaced apart from each other in the first direction DR1. The second bank patterns BP2 may have a same width, but are not limited thereto, and may have their widths different from each other. A length of the second bank patterns BP2, which are extended in the second direction DR2, may be longer than a length of the light emission area EMA surrounded by the bank layer BNL and extended in the second direction DR2, but is not limited thereto. The second bank patterns BP2 extended in the second direction DR2 may be shorter than the light emission area EMA surrounded by the bank layer BNL and extended in the second direction DR2.

The first bank pattern BP1 may be disposed at a center of the light emission area EMA, and the second bank patterns BP2 may be spaced apart from each other with the first bank pattern BP1 interposed therebetween. The first bank pattern BP1 and the second bank patterns BP2 may be alternately disposed in the first direction DR1. The light emitting elements ED may be disposed between the first bank pattern BP1 and the second bank patterns BP2.

The first bank pattern BP1 and the second bank patterns BP2 may have a same length in the second direction DR2, but may have different widths measured in the first direction DR1. A portion of the bank layer BNL, which is extended in the second direction DR2, may overlap the second bank patterns BP2 in the thickness direction (e.g., third direction DR3).

The bank pattern BP may further include a first connection portion CP1 and a second connection portion CP2, which connect the first bank pattern BP1 with the second bank pattern BP2. The first connection portion CP1 may be disposed in the light emission area EMA of the subpixel SPXn, and may have a shape extended in the first direction DR1. The first connection portion CP1 may be disposed between the first bank pattern BP1 and the second bank pattern BP2 to connect the first bank pattern BP1 with the second bank pattern BP2. For example, the first connection portion CP1 may be disposed between the second bank pattern BP2 disposed on a left side of the first bank pattern BP1 and the first bank pattern BP1.

The second connection portion CP2 may be disposed in the light emission area EMA of the subpixel SPXn, and may have a shape extended in the first direction DR1. The second connection portion CP2 may be disposed between the first bank pattern BP1 and the second bank pattern BP2 to connect the first bank pattern BP1 with the second bank pattern BP2. For example, the first bank pattern BP1 may be disposed between the second bank pattern BP2 disposed on a right side of the first bank pattern BP1 and the first bank pattern BP1.

The first connection portion CP1 and the second connection portion CP2 may be spaced apart from each other with the first bank pattern BP1 interposed therebetween. The first connection portion CP1 and the second connection portion CP2 may be aligned and matched with each other in the first direction DR1. The first connection portion CP1 and the second connection portion CP2 may be approximately at the center of the emission area EMA of the subpixel SPXn, so that the first connection portion CP1 and second connection portion CP2 may not overlap the bank layer BNL in the thickness direction. The first connection portion CP1 and the second connection portion CP2 may be disposed in an area in which the length of the first bank pattern BP1 extended in the second direction DR2 is divided into two. A width of each of the first connection portion CP1 and the second connection portion CP2 in the second direction DR2 may be smaller than a width of the first bank pattern BP1 in the first direction DR1, but is not limited thereto. The width of each of the first connection portion CP1 and the second connection portion CP2 in the second direction DR2 may be greater than or equal to the width of the first bank pattern BP1 in the first direction DR1.

The first bank pattern BP1, the second bank patterns BP2, the first connection portion CP1, and the second connection portion CP2 may be connected to one another to form a single body (or they may be integral with each other). For example, the first bank pattern BP1 and the second bank patterns BP2 may be connected to the first connection portion CP1 and the second connection portion CP2 to form a single body.

The first bank pattern BP1, the second bank patterns BP2, the first connection portion CP1, and the second connection portion CP2 may have a structure in which at least a portion thereof is protruded based on an upper surface of the via layer VIA. Protruded portions of the first bank pattern BP1, the second bank patterns BP2, the first connection portion CP1, and the second connection portion CP2 may have inclined or curved sides. Unlike the example illustrated in the drawing, each of the first bank pattern BP1, the second bank patterns BP2, the first connection portion CP1, and the second connection portion CP2 may have a semicircular or semi-elliptical outer surface in a cross-sectional view.

The first connection portion CP1 and the second connection portion CP2 may have a thickness (e.g., a predetermined or selectable thickness) in the third direction DR3. The thickness of each of the first connection portion CP1 and the second connection portion CP2 may be smaller than a thickness of each of the first bank pattern BP1 and the second bank patterns BP2. For example, the thickness of each of the first connection portion CP1 and the second connection portion CP2 may be in a range of about 1000 Å to about 5000 Å.

The first bank patterns BP1, the second bank patterns BP2, the first connection portion CP1, and the second connection portion CP2 may be formed at a same time. For example, the first bank pattern BP1, the second bank patterns BP2, the first connection portion CP1, and the second connection portion CP2 may be formed using a halftone mask at a same time after being coated with an organic insulating material. The first bank patterns BP1, the second bank patterns BP2, the first connection portion CP1, and the second connection portion CP2 may include organic insulating materials such as polyimide (PI), but are not limited thereto.

The electrodes RME may be disposed in each subpixel SPXn in a shape extended in a direction. The electrodes RME may be extended in the second direction DR2 and thus disposed over the light emission area EMA and the sub-areas SA of the subpixel SPXn. The electrodes RME may be spaced apart from each other in the first direction DR1. The electrodes RME may be electrically connected to the light emitting element ED, which will be described below, but is not limited thereto. The electrodes RME may not be electrically connected to the light emitting element ED.

The display device 10 may include a first electrode RME1, a second electrode RME2, and a third electrode RME3. The first electrode RME1 may be disposed at a center of each subpixel SPXn, the second electrode RME2 may be disposed on a left side of the first electrode RME1 and disposed over another adjacent subpixels SPXn, and the third electrode RME3 may be disposed on a right side of the first electrode RME1 and disposed over another adjacent subpixels SPXn.

The first electrode RME1 may be disposed at the center of the subpixel SPXn, and its portion disposed in the light emission area EMA may be disposed on the first bank pattern BP1. The first electrode RME1 may be extended from the first sub-area SA1 disposed above the light emission area EMA in an opposite direction of the second direction DR2 and extended to the second sub-area SA2 disposed below the light emission area EMA. The first electrode RME1 may have a shape in which the width measured in the first direction DR1 may vary depending on a position thereof, and its portion overlapped with the light emitting element ED in at least the light emission area EMA may have a width greater than the width of the first bank pattern BP1.

The first electrode RME1 may include concave portions GR: GR1 and GR2 extended in the second direction DR2, having a width that is narrowed in the first direction DR1. The concave portions GR may be disposed in the emission area EMA of each subpixel SPXn, and on a plane, a side of the first electrode RME1 may be concave in the first direction DR1 or an opposite direction of the first direction DR1. The concave portions GR may include a first concave portion GR1 disposed on a side of the first electrode RME1 opposite to the second electrode RME2, and a second concave portion GR2 disposed on another side of the first electrode RME1 opposite to the third electrode RME3.

The first concave portion GR1 may be formed in a shape in which a side of the first electrode RME1 opposite to the second electrode RME2 is concave in the first direction DR1. The second concave portion GR2 may be formed in a shape in which another side of the first electrode RME1 opposite to the third electrode RME3 is concave in the opposite direction of the first direction DR1. The first concave portion GR1 and second concave portion GR2 may have a same depth recessed toward a center portion of the first electrode RME1 as each other. The first concave portion GR1 and second concave portion GR2 may have a same width in the second direction DR2. For example, the first concave portion GR1 and second concave portion GR2 may be symmetrically formed based on a random straight line extended from the center of the first electrode RME1 in the second direction DR2. Although FIGS. 3 and 4 show that corners of the first concave portion GR1 and the second concave portion GR2 may be perpendicular to each other, the disclosure is not limited thereto, and the corners may have a round shape such as a semicircle or a semi-elliptical shape.

The second electrode RME2 may include a portion extended in the second direction DR2 and a portion having a width that becomes wider near the light emission area EMA. According to an embodiment, the second electrode RME2 may include a first stem portion RM_S1 extended in the second direction DR2, and a first extension portion RM_B1 connected or extended from the first stem portion RM_S1, having a width in the first direction DR1, which is wider than a width of the first stem portion RM_S1. The second electrode RME2 may include a first protrusion RM_P1 protruded from the first extension portion RM_B1 in the first direction DR1.

The first stem portion RM_S1 may be disposed to overlap a portion of the bank layer BNL, which is extended in the first direction DR1, and may be disposed on a side of the sub-areas SA1 and SA2 in the second direction DR2. The second electrode RME2 may be disposed between the first sub-area SA1 and the first sub-area SA1 and between the second sub-area SA2 and the second sub-area SA2 of the subpixels SPXn to which the first stem portion RM_S1 is adjacent in the second direction DR2. The first stem portion RM_S1 may be disposed between the first sub-area SA1 and the second sub-area SA2 adjacent to each other in the second direction DR2 (or arranged in the second direction DR2), and a portion thereof may be protruded toward the sub-areas SA1 and SA2.

The first extension portion RM_B1 may be disposed at the center of the subpixel SPXn in the opposite direction of the first direction DR1, and may be disposed on the second bank pattern BP2 disposed on a left side of the subpixels SPXn. The second electrode RME2 may have a shape in which its width in the first direction DR1 is increased in a portion where a portion of the bank layer BNL, which is extended in the second direction DR2, and a portion of the bank layer BNL, which is extended in the first direction DR1, cross each other. The first extension portion RM_B1 may be disposed over the light emission area EMA of the subpixels SPXn adjacent to each other in the first direction DR1, and may be disposed to overlap an area between the subpixels SPXn. The first extension portion RM_B1 may overlap a portion disposed between adjacent subpixels SPXn among portions of the bank layer BNL, which are extended in the opposite direction of the first direction DR1.

The first protrusion RM_P1 may be approximately disposed at the center of the subpixel SPXn, and may be disposed on the first connection portion CP1 of the second bank pattern BP2. A width of the first protrusion RM_P1 in the second direction DR2 may be greater than a width of the first connection portion CP1 in the second direction DR2. The first protrusion RM_P1 may cover an upper surface of the first connection portion CP1 and sides of the first connection portion CP1 in the second direction DR2. The first protrusion RM_P1 may be protruded from a side of the second electrode RME2 opposite to the first electrode RME1 toward the first electrode RME1. The first protrusion RM_P1 may be disposed in a shape inserted into the first concave portion GR1 of the first electrode RME1 on a plane. For example, an end of the first protrusion RM_P1 may be disposed in the first concave portion GR1 of the first electrode RME1.

The third electrode RME3 may include a portion extended in the second direction DR2 and a portion having a wide that becomes wider near the light emission area EMA. According to an embodiment, the third electrode RME3 may include a second stem portion RM_S2 extended in the second direction DR2, and a second extension portion RM_B2 connected or extended from the second stem portion RM_S2, having a width in the first direction DR1, which is wider than a width of the second stem portion RM_S2. The third electrode RME3 may include a second protrusion RM_P2 protruded from the second extension portion RM_B2 in the opposite direction of the first direction DR1.

As in the subpixels SPXn shown in FIGS. 3 and 4, the second electrode RME2 may be disposed on a left side based on the first electrode RME1, and the third electrode RME3 may be disposed on a right side based thereon. In case that viewed from another subpixel SPXn adjacent to the subpixel SPXn in the first direction DR1, the third electrode RME3 may be extended beyond the bank layer BNL to act as the second electrode RME2. In the disclosure, the second electrode RME2 and the third electrode RME3 will be described based on a subpixel SPXn, but the second electrode RME2 and the third electrode RME3 may be a same electrode in view of the entire display device 10.

The second stem portion RM_S2 of the third electrode RME3 may be disposed to overlap a portion of the bank layer BNL, which is extended in the first direction DR1, and may be disposed on a side of the sub-areas SA1 and SA2 in the second direction DR2. The third electrode RME3 may be disposed between the first sub-area SA1 and the first sub-area SA1 and between the second sub-area SA2 and the second sub-area SA2 of the subpixels SPXn to which the second stem portion RM_S2 is adjacent in the second direction DR2. The second stem portion RM_S2 may be disposed between the first sub-area SA1 and the second sub-area SA2 adjacent to each other in the second direction DR2, and a portion thereof may be protruded toward the sub-areas SA1 and SA2.

The second extension portion RM_B2 may be disposed at the center of the subpixel SPXn in the first direction DR1, and may be disposed on the second bank pattern BP2 disposed on a right side of the subpixels SPXn. The third electrode RME3 may have a shape in which its width in the first direction DR1 is increased in a portion where a portion of the bank layer BNL, which is extended in the second direction DR2, and a portion of the bank layer BNL, which is extended in the first direction DR1, cross (or intersect) each other. The second extension portion RM_B2 may be disposed over the light emission area EMA of the subpixels SPXn adjacent to each other in the first direction DR1, and may be disposed to overlap an area between the subpixels SPXn. The second extension portion RM_B2 may overlap a portion disposed between adjacent subpixels SPXn among portions of the bank layer BNL, which are extended in the first direction DR1.

The second protrusion RM_P2 may be approximately disposed at the center of the subpixel SPXn, and may be disposed on the second connection portion CP2 of the second bank pattern BP2. A width of the second protrusion RM_P2 in the second direction DR2 may be greater than a width of the second connection portion CP2 in the second direction DR2. The second protrusion RM_P2 may cover an upper surface of the second connection portion CP2 and sides of the second connection portion CP2 in the second direction DR2. The second protrusion RM_P2 may be protruded from a side of the third electrode RME3 opposite to the first electrode RME1 toward the first electrode RME1. The second protrusion RM_P2 may be disposed in a shape inserted into the second concave portion GR2 of the first electrode RME1 on a plane. For example, an end of the second protrusion RM_P2 may be disposed in the second concave portion GR2 of the first electrode RME1.

The width of the first electrode RME1, which is measured in the first direction DR1, may be greater than the width of each of the first stem portion RM_S1 of the second electrode RME2 and the second stem portion RM_S2 of the third electrode RME3, and may be smaller than the width of each of the first extension portion RM_B1 and the second extension portion RM_B2. As the first stem portion RM_S1 of the second electrode RME2 and the second stem portion RM_S2 of the third electrode RME3 are disposed between the first sub-area SA1 and the second sub-area SA2, their widths may be relatively small, whereas the first extension portion RM_B1 and the second extension portion RM_B2 may have a width greater than a width of the first electrode RME1. The first electrode RME1 may be disposed to cover sides (or both sides) of the first bank pattern BP1 in the first direction DR1, and the second electrode RME2 and the third electrode RME3 may be disposed to cover sides (or both sides) of the second bank pattern BP2 in the first direction DR1. An interval between the first bank pattern BP1 and the second bank pattern BP2 may be greater than an interval between the first electrode RME1 and the second electrode RME2 and between the first electrode RME1 and the third electrode RME3.

The first electrode RME1 may contact the first conductive pattern CDP1 of the third conductive layer through a first electrode contact hole CTD in a portion overlapped with the portion of the bank layer BNL, which is extended in the first direction DR1. The second electrode RME2 may contact the second conductive pattern CDP2 of the third conductive layer through a second electrode contact hole CTS in the first stem portion RM_S1. The first electrode RME1 may include a portion disposed in the first sub-area SA1 to overlap a first contact hole CT1, and the second electrode RME2 may include a portion protruded from the first stem portion RM_S1 in the second direction DR2 and disposed in the first sub-area SA1, and may overlap a second contact hole CT2 in the protruded portion.

The first electrode RME1 may be disposed to reach the partition portions ROP1 and ROP2 of the sub-areas SA1 and SA2, whereas the second electrode RME2 may not be separated from the sub-areas SA1 and SA2. The second electrode RME2 and the third electrode RME3 may be extended in the second direction DR2, and may have a shape in which a width thereof is increased near the light emission area EMA of each of the subpixels SPXn.

According to an embodiment, the display device 10 may include a line connection electrode EP disposed in the first sub-area SA1 and disposed between the first electrodes RME1 of different subpixels SPXn. The line connection electrode EP may not be disposed in the second sub-area SA2, and the first electrodes RME1 of other subpixels SPXn adjacent to each other in the second direction DR2 may be spaced apart from each other.

The first electrode RME1 may be spaced apart from the line connection electrode EP with the first partition portion ROP1 interposed therebetween in the first sub-area SA1. Two first partition portions ROP1 may be disposed in the first sub-area SA1, and the line connection electrode EP may be spaced apart from the first electrode RME1 with the first partition portion ROP1 interposed therebetween. One second partition portion ROP2 may be disposed in the second sub-area SA2, and different first electrodes RME1 may be spaced apart from each other in the first direction DR1.

The line connection electrode EP may be connected to the third conductive pattern CDP3 of the third conductive layer through a third electrode contact hole CTA that passes through the via layer VIA. The first electrode RME1 may be formed to be connected to the line connection electrode EP, and an electrical signal applied to dispose the light emitting elements ED may be applied from the first voltage line VL1 to the first electrode RME1 through the line connection electrode EP. In a process of disposing the light emitting element ED, signals may be applied to the first voltage line VL1 and the second voltage line VL2, and the signals may be transferred to the first electrode RME1 and the second electrode RME2.

The second electrode contact hole CTS may have a relative arrangement different from an arrangement the third electrode contact hole CTA. The second electrode contact hole CTS may be disposed in the second sub-area SA2, and the third electrode contact hole CTA may be disposed in the first sub-area SA1. Since the second electrode contact hole CTS and the third electrode contact hole CTA expose upper surfaces of the conductive patterns CDP2 and CPD3 different from each other, a position of each electrode contact hole may be determined to correspond to each of the exposed upper surfaces.

Each of the electrodes RME may include a conductive material having high reflectance. For example, the electrodes RME may include a metal such as silver (Ag), copper (Cu), aluminum (Al), or the like, or may be an alloy that includes aluminum (Al), nickel (Ni), lanthanum (La), and the like. However, the embodiments are not limited thereto. The electrodes RME may reflect light emitted from the light emitting element ED, moving to the sides of the bank patterns BP, toward an upper direction of each subpixel SPXn.

However, without limitation to the above example, each electrode RME may further include a transparent conductive material. For example, each electrode RME may include a material such as ITO, IZO, ITZO, or the like. In some embodiments, each of the electrodes RME may have a structure in which one or more layers of a transparent conductive material and a metal layer having high reflectance are stacked with each other, or may be formed as a single layer including the transparent conductive material and the metal layer. For example, each electrode RME may have a stacked structure such as ITO/Ag/ITO/, ITO/Ag/IZO, ITO/Ag/ITZO/IZO, or the like.

The first insulating layer (or insulating layer) PAS1 may be disposed on the via layer VIA, the bank pattern BP, and the electrodes RME. The first insulating layer PAS1 may be on the via layer VIA to cover the electrodes RME and the bank pattern BP. Also, the first insulating layer PAS1 may not be disposed in the first partition portion ROP1 of the first sub-area SA1 and the second partition portion ROP2 of the second sub-area SA2. The first insulating layer PAS1 may protect the electrodes RME and at a same time mutually insulate different electrodes RME. Also, the first insulating layer PAS1 may prevent the light emitting element ED disposed thereon from being damaged due to direct contact with other members. In an embodiment, the first insulating layer PAS1 may be stepped (or may have height or thickness differences) such that an upper surface of the first insulating layer PAS1 is partially recessed between the electrodes RME spaced apart from each other in the first direction DR1 (e.g., between the first electrode RME1 and the second electrode RME2 and between the first electrode RME1 and the third electrode RME3). The light emitting elements ED may be disposed on the upper surface of the first insulating layer PAS1 that is stepped, and a space may be formed between the light emitting elements ED and the first insulating layer PAS1. The space may be filled with the second insulating layer PAS2 that will be described below.

The first insulating layer PAS1 may include contact holes CT1 and CT2 that expose a portion of the upper surfaces of the electrodes RME. The contact holes CT1 and CT2 may pass through the first insulating layer PAS1, and the first connection electrode CNE1 and the second connection electrode CNE2, which will be described below, may directly contact the electrodes RME exposed through the contact holes CT1 and CT2, respectively.

Also, the first insulating layer PAS1 may include an opening OP that exposes a portion of the upper surface of each of the electrodes RME and a portion of an upper surface of the bank pattern BP. The opening OP may expose a portion of the upper surface of the electrodes RME therebelow and a portion of the upper surface of the bank pattern BP as the first insulating layer PAS1 is removed. The opening OP may overlap the concave portions GR of the first electrode RME1, the first protrusion RM_P1 of the second electrode RME2, and the second protrusion RM_P2 of the third electrode RME3 in the third direction DR3. The opening OP may overlap the first bank pattern BP1, and the first connection portion CP1 and the second connection portion CP2 of the second bank pattern BP2 in the third direction DR3.

The bank layer BNL may be disposed on the first insulating layer PAS1. The bank layer BNL may include a portion extended in the first direction DR1 and the second direction DR2 on a plan view, and may be disposed in a lattice pattern. Also, the bank layer BNL may be disposed over a boundary of the subpixels SPXn to distinguish the subpixels SPXn adjacent to each other. The bank layer BNL may be disposed to surround the light emission area EMA and the sub-areas SA, and areas partitioned and opened by the bank layer BNL may be the light emission area EMA and the sub-area SA.

The bank layer BNL may have a height (e.g., a predetermined or selectable height), and in some embodiments, the bank layer BNL may be higher than the bank pattern BP in its height on the upper surface, and a thickness of the bank layer BNL may be equal to or greater than a thickness of the bank pattern BP, but the disclosure is not limited thereto. The bank layer BNL may have a height of the upper surface, which is equal to or lower than a height of the bank pattern BP, and a thickness of the bank layer BNL may be smaller than a thickness of the bank pattern BP. The bank layer BNL may prevent ink from overflowing to the subpixel SPXn adjacent thereto in the second direction DR2 or prevent ink from overflowing to the sub-area SA disposed in the first direction DR1 in an inkjet printing process during a manufacturing process of the display device 10. The bank layer BNL may prevent inks in which different light emitting elements ED are dispersed for each different subpixel SPXn from being mixed with each other. The bank layer BNL may include polyimide in the substantially same manner as the bank pattern BP, but is not limited thereto.

The light emitting elements ED may be disposed in the light emission area EMA. The light emitting elements ED may be disposed on the first insulating layer PAS1 between the bank patterns BP (e.g., between the first bank pattern BP1 and the second bank pattern BP2). The light emitting element ED may be disposed such that its portion extended in a direction is parallel with the upper surface of the substrate SUB. The light emitting element ED may include semiconductor layers disposed in the extended direction, and the semiconductor layers may be sequentially disposed in the direction parallel with the upper surface of the substrate SUB, but are not limited thereto. In case that the light emitting element ED has another structure, the semiconductor layers may be disposed in a direction perpendicular to the substrate SUB.

The light emitting elements ED disposed in the subpixels SPXn may emit light of different wavelength bands depending on a material of the semiconductor layer, but are not limited thereto. The light emitting elements ED disposed in the subpixels SPXn may include semiconductor layers of the same material to emit light of a same color. The light emitting elements ED may contact the connection electrodes CNE and thus electrically connected to the conductive layers below the electrodes RME and the via layer VIA, and may emit light of a specific wavelength band as an electric signal is applied thereto.

According to an embodiment, the light emitting elements ED may be disposed on the electrodes RME spaced apart from each other in the first direction DR1 between the first bank pattern BP1 and the second bank pattern BP2, and may be divided into light emitting elements ED1, ED2, ED3, and ED4 disposed on different electrodes RME. The light emitting elements ED may be disposed between the first bank pattern BP1 and the second bank pattern BP2. According to an embodiment, the light emitting elements ED may include a first light emitting element ED1 and a third light emitting element ED3, which are disposed between the first bank pattern BP1 and the second bank pattern BP2 disposed on the left side of the subpixels SPXn, and may include a second light emitting element ED2 and a fourth light emitting element ED4, which are disposed between the first bank pattern BP1 and the second bank pattern BP2 disposed on the right side of the subpixels SPXn.

The first light emitting element ED1 and the third light emitting element ED3 may be disposed on the first electrode RME1 and the second electrode RME2, and the second light emitting element ED2 and the fourth light emitting element ED4 may be disposed on the first electrode RME1 and the third electrode RME3. However, each of the light emitting elements ED may not be divided depending on a position in the light emission area EMA, but may be divided depending on a connection relation with the connection electrodes CNE, which will be described below. Each of the light emitting elements ED may have different connection electrodes CNE, which ends contact, depending on an arrangement structure of the connection electrodes CNE, and may be divided into different light emitting elements ED depending on a type of the connection electrodes CNE which the light emitting elements ED contact.

The above-described light emitting elements ED may be aligned between the electrodes RME (e.g., between the first electrode RME1 and the second electrode RME2, between the first electrode RME1 and the third electrode RME3) by being sprayed onto the light emission area EMA in a state that they are dispersed in an ink after the bank layer BNL is formed on the first insulating layer PAS1. As shown in FIG. 3, the connection electrodes CNE, which may contact sides (or both sides) of the light emitting elements ED, may not be disposed at the center of the light emission area EMA, so that the light emitting elements ED may not emit light even though the light emitting elements ED are aligned at the center of the light emission area EMA.

According to an embodiment, even though the ink in which the light emitting elements ED are dispersed is sprayed in the light emission area EMA, the ink is not coated on the center of the light emission area EMA, whereby the display device 10, which may minimize the light emitting elements ED for not emitting light, may be provided.

Figure 8:
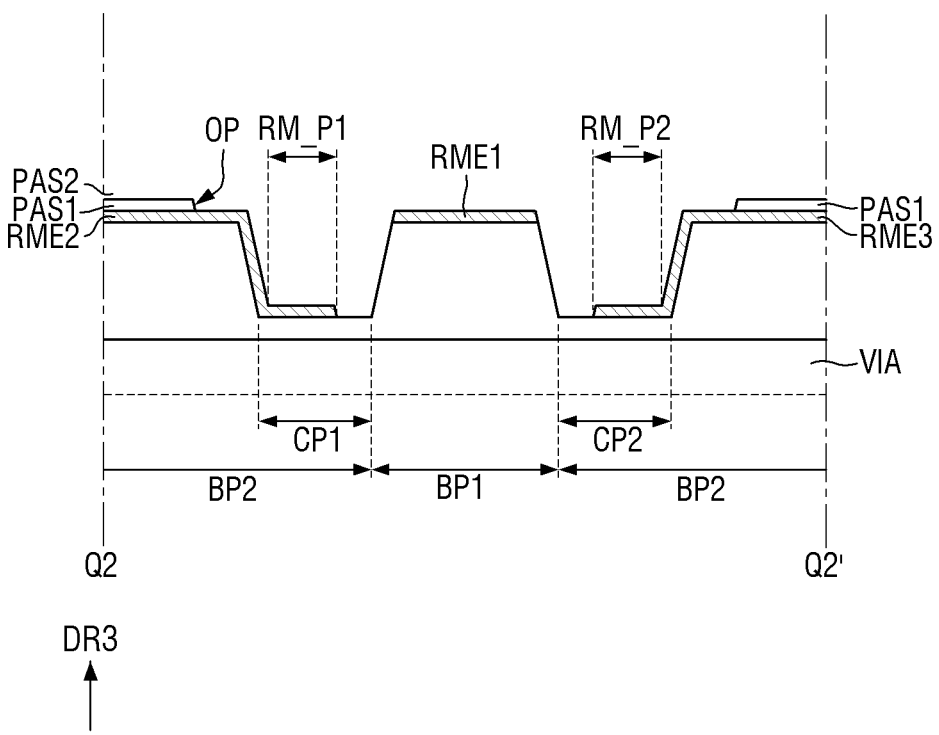
FIG. 8 is another schematic cross-sectional view taken along line Q2-Q2' of FIG. 4.
Figure 9:
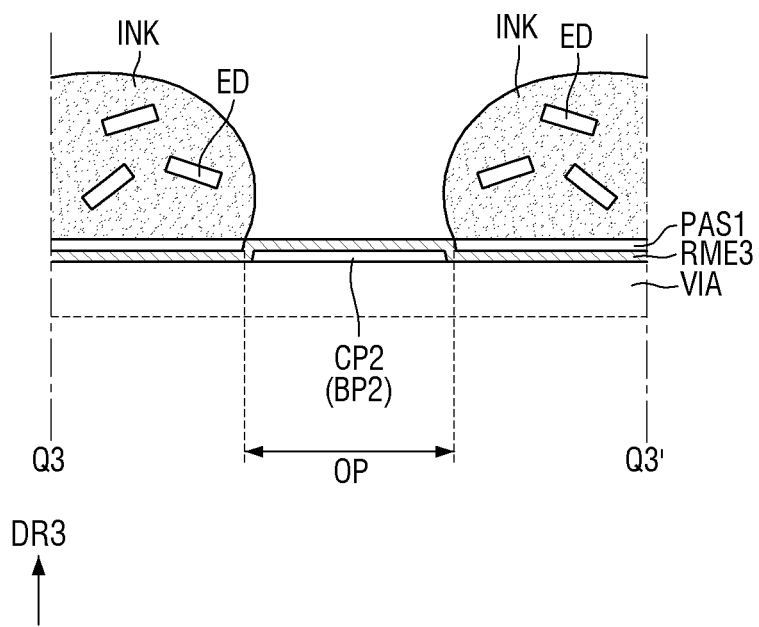
FIG. 9 is another schematic cross-sectional view taken along line Q3-Q3' of FIG. 4.

FIG. 8 is another schematic cross-sectional view taken along line Q2-Q2' of FIG. 4. FIG. 9 is another schematic cross-sectional view taken along line Q3-Q3' of FIG. 4. FIGS. 8 and 9 show the bank pattern BP, the electrodes RME and the first insulating layer PAS1, which are shown in FIG. 4, and show that the ink in which the light emitting elements ED are dispersed is coated thereon.

Referring to FIGS. 8 and 9 in conjunction with FIG. 4, each subpixel SPXn may include electrodes RME and bank patterns BP, which are disposed at a center of the light emission area EMA. As described above, the first connection portion CP1 and the second connection portion CP2, which connect the first bank pattern BP1 with the second bank pattern BP2, may be disposed at the center of the light emission area EMA. The first electrode RME1 may include concave portions GR, the second electrode RME2 may include a first protrusion RM_P1 protruded toward the first concave portion GR1, covering the first connection portion CP1, and the third electrode RME3 may include a second protrusion RM_P2 protruded toward the second concave portion GR2, covering the second connection portion CP2. A first insulating layer PAS1 may be disposed on the electrodes RME and the bank patterns BP, and the first insulating layer PAS1 may include an opening OP that exposes the electrodes RME and the bank pattern BP therebelow.

In the opening OP, an upper surface of the bank pattern BP may be generally covered by the electrodes RME. For example, the second electrode RME2 and the first protrusion RM_P1 of the second electrode RME2 may cover a side of the second bank pattern BP2 and the first connection portion CP1, and the third electrode RME3 and the second protrusion RM_P2 of the third electrode RME3 may cover another side of the second bank pattern BP2 and the second connection portion CP2. The first electrode RME1 may cover the upper surface of the first bank pattern BP1. For example, the electrodes RME may be disposed in the areas exposed by the opening OP.

The ink INK in which the light emitting elements ED are dispersed may be sprayed to upper and lower sides of the light emission area EMA. Since the first insulating layer PAS1 is disposed in most of the light emission area EMA, the ink INK may be spread along a surface of the first insulating layer PAS1 and then may stop spreading by arriving at surfaces of the electrodes RME exposed to the opening OP of the first insulating layer PAS1. For example, in case that the ink INK is spread along the surface of the first insulating layer PAS1 and arrives at the surfaces of the electrodes RME that are materials different from the first insulating layer PAS1, spreading of the ink may stop due to a difference in a contact angle with the ink. Therefore, coating of the ink on the center of the light emission area EMA may be minimized to reduce the light emitting elements ED for not emitting light.

Also, in an embodiment, the first connection portion CP1 and the second connection portion CP2, which connect the first bank pattern BP1 with the second bank pattern BP2, may be formed, and a first protrusion RM_P1 of the second electrode RME2 and a second protrusion RM_P2 of the third electrode RME3 may be formed to cover the first connection portion CP1 and the second connection portion CP2. The second electrode RME2 and the third electrode RME3 may be stepped by the first connection portion CP1 and the second connection portion CP2. In case that the first insulating layer PAS1 is formed and partially removed to form an opening OP, an upper surface of the first insulating layer PAS1 may be aligned and matched with upper surfaces of the second electrode RME2 and the third electrode RME3. For example, a height of the upper surface of the second electrode RME2 or the third electrode RME3 from the via layer VIA in the area where the first connection portion CP1 and the second connection portion CP2 are disposed may be substantially equal to a height of the upper surface of the first insulating layer PAS1 from the via layer VIA in an area where the first connection part CP1 and the second connection part CP2 are not disposed.

In case that the first connection portion CP1 and second connection portion CP2 are not formed, the height of the second electrode RME2 or the third electrode RME3 in the opening OP of the first insulating layer PAS1 may be lower than the height of the first insulating layer PAS1 to generate a groove. This groove may form a high-low difference to allow the ink to be spread into the opening OP of the first insulating layer PAS1, whereby it is difficult to prevent the ink from being spread to the center of the light emission area EMA.

Referring back to FIGS. 3 and 5, the connection electrodes CNE: CNE1, CNE2, CNE3, CNE4, and CNE5 may be disposed on the electrodes RME and the bank patterns BP1 and BP2. Each of the connection electrodes CNE may have a shape extended in a direction, and may be disposed to be spaced apart from each other. Each of the connection electrodes CNE may contact the light emitting element ED, and may be electrically connected to a conductive layer therebelow.

The connection electrodes CNE may include a first connection electrode CNE1, a second connection electrode CNE2, a third connection electrode CNE3, a fourth connection electrode CNE4, and a fifth connection electrode CNE5, which are disposed in each subpixel SPXn.

The first connection electrode CNE1 may have a shape generally extended in the second direction DR2, and may be disposed on the first electrode RME1. The first connection electrode CNE1 may partially overlap the first electrode RME1 and the first bank pattern BP1, and may be disposed over the light emission area EMA and the sub-areas SA1 and SA2. The second connection electrode CNE2 may be extended in a diagonal direction, and may be disposed on the third electrode RME3 while having a doughnut-shaped bypass path. The second connection electrode CNE2 may partially overlap the third electrode RME3 and the second bank pattern BP2, and may be disposed over the light emission area EMA and the first sub-area SA1. The first connection electrode CNE1 and the second connection electrode CNE2 may be disposed on an upper side of the light emission area EMA of the subpixel SPXn.

The third connection electrode CNE3 may have a shape extended in the diagonal direction and then extend in the second direction DR2 while having a doughnut-shaped bypass path, and may be disposed on the second electrode RME2 and the first electrode RME1. The third connection electrode CNE3 may partially overlap the first electrode RME1 and the second electrode RME2, and may partially overlap the first bank pattern BP1 and the second bank pattern BP2. The third connection electrode CNE3 may be generally disposed in the light emission area EMA, and may be extended from an upper side to a lower side of the light emission area EMA of the subpixel SPXn.

The fourth connection electrode CNE4 may be extended in the second direction DR2, and then may be disposed on the third electrode RME3 and the first electrode RME1 while having a doughnut-shaped bypass path. The fourth connection electrode CNE4 may partially overlap the first electrode RME1 and the third electrode RME3, and may partially overlap the first bank pattern BP1 and the second bank pattern BP2. The fourth connection electrode CNE4 may be generally disposed in the light emission area EMA, and may be extended from the upper side to the lower side of the light emission area EMA of the subpixel SPXn.

The fifth connection electrode CNE5 may be extended in the first direction DR1 while having a doughnut-shaped bypass path, and then may be disposed the first electrode RME1 and the second electrode RME2 while having a shape bent in the second direction DR2. The fifth connection electrode CNE5 may partially overlap the first electrode RME1 and the second electrode RME2, and may partially overlap the first bank pattern BP1 and the second bank pattern BP2. The fifth connection electrode CNE5 may be generally disposed in the light emission area EMA, and may be disposed at the lower side of the light emission area EMA of the subpixel SPXn.

Each of the second connection electrode CNE2, the third connection electrode CNE3, the fourth connection electrode CNE4, and the fifth connection electrode CNE5 may have a shape having a doughnut-shaped bypass path, and the first connection electrode CNE1 may not have a bypass path, and may be bent linearly.

The light emitting elements ED may be divided into different light emitting elements ED depending on the connection electrode CNE which ends of the light emitting elements ED may contact, in response to the arrangement structure of the connection electrodes CNE. The first light emitting element ED1 may contact the first connection electrode CNE1 and the third connection electrode CNE3, and the second light emitting element ED2 may contact the second connection electrode CNE2 and the fourth connection electrode CNE4. The third light emitting element ED3 may contact the third connection electrode CNE3 and the fifth connection electrode CNE5, and the fourth light emitting element ED4 may contact the fourth connection electrode CNE4 and the fifth connection electrode CNE5.

As described below, ends of the light emitting elements ED, which are extended, may be distinguished from each other, and the light emitting elements ED may be connected to each other in series through connection electrodes CNE which ends of the light emitting elements ED may contact. The display device 10 may include a larger number of light emitting elements ED for each subpixel SPXn, and may constitute series connection thereof, so that the amount of light emission per unit area may be increased.

Figure 10:
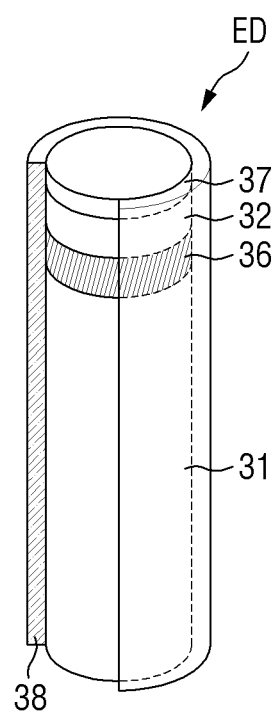
FIG. 10 is a schematic view illustrating a light emitting element according to an embodiment.

FIG. 10 is a schematic view illustrating a light emitting element according to an embodiment.

Referring to FIG. 10, the light emitting element ED may be a light emitting diode. In detail, the light emitting element ED may be an inorganic light emitting diode made of an inorganic material with a size of a nano-meter to a micro-meter. The light emitting element ED may be aligned between two electrodes facing each other and having polarities in accordance with an electric field formed in a specific direction between the two electrodes.

The light emitting element ED may have a shape extended in a direction. The light emitting element ED may have a shape such as a cylinder, a rod, a wire, and a tube, but is not limited thereto. The light emitting element ED may have a polygonal pillar shape such as a cube, a cuboid, and a hexagonal pillar, or may have various shapes such as a shape extended in a direction, having an outer surface that is partially inclined.

The light emitting element ED may include a semiconductor layer doped with any conductivity type (e.g., p-type or n-type) dopants. The semiconductor layer may emit light of a specific wavelength band as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be a layer formed of (or include) at least one of AlGaInN, GaN, AlGaN, InGaN, AlN, InN, and the like, which are doped with n-type dopants. The n-type dopants doped in the first semiconductor layer 31 may be Si, Ge, Sn, Se, or the like.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be a layer formed of (or include) at least one of AlGaInN, GaN, AlGaN, InGaN, AlN, InN, and the like, which are doped with p-type dopants. The p-type dopants doped in the second semiconductor layer 32 may be Mg, Zn, Ca, Ba, or the like.

The first semiconductor layer 31 and the second semiconductor layer 32 may be shown as being formed of a single layer, but are not limited thereto. The first semiconductor layer 31 and the second semiconductor layer 32 may further include a larger number of layers, such as a clad layer or a tensile strain barrier reducing (TSBR) layer, depending on a material of the light emitting layer 36. For example, the light emitting element ED may further include another semiconductor layer disposed between the first semiconductor layer 31 and the light emitting layer 36, or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, SLs, and the like, which are doped with n-type dopants. The semiconductor layer disposed between the second semiconductor layer 32 and the light emitting layer 36 may be any one or more of AlGaInN, GaN, AlGaN, InGaN, AlN, InN, and the like, which are doped with p-type dopants.

The light emitting layer 36 may be disposed between the first semiconductor layer 31 and the second semiconductor layer 32. The light emitting layer 36 may include a material of a single or multiple quantum well structure. In case that the light emitting layer 36 includes a material of a multiple quantum well structure, quantum layers and well layers may be alternately stacked with each other. The light emitting layer 36 may emit light by combination of electron-hole pairs in accordance with electrical signals applied through the first semiconductor layer 31 and the second semiconductor layer 32. The light emitting layer 36 may include a material such as AlGaN, AlGaInN, InGaN, or the like. In case that the light emitting layer 36 has a stacked structure of quantum layers and well layers, which are alternately stacked in a multiple quantum well structure, the quantum layer may include a material such as AlGaN, AlGaInN, or the like, and the well layer may include a material such as GaN, AlInN, or the like.

The light emitting layer 36 may have a structure in which a semiconductor material having a big band gap energy and semiconductor materials having a small band gap energy are alternately stacked with each other, and may include group-III or group-V semiconductor materials depending on a wavelength band of light that is emitted. The light emitting layer 36 may emit light of a red or green wavelength band, as a case may be, without limitation to light of a blue wavelength band.

The electrode layer 37 may be an ohmic connection electrode, but is not limited thereto. The electrode layer 37 may be a Schottky connection electrode. The light emitting element ED may include at least one electrode layer 37. Although the light emitting element ED includes one or more electrode layers 37, the disclosure is not limited thereto. For example, the electrode layer 37 may be omitted.

The electrode layer 37 may reduce resistance between the light emitting element ED and an electrode or a connection electrode in case that the light emitting element ED is electrically connected with the electrode or the connection electrode in the display device 10. The electrode layer 37 may include a metal having conductivity. For example, the electrode layer 37 may include at least one of Al, T1, In, Au, Ag, ITO, IZO, ITZO, and the like.

The insulating layer 38 may be disposed to surround outer surfaces of the above-described semiconductor layers 31 and 32 and electrode layer 37. For example, the insulating layer 38 may be disposed to surround at least an outer surface of the light emitting layer 36, and may be formed to expose ends of the light emitting element ED in a longitudinal direction. Also, the insulating layer 38 may be formed with a rounded upper surface on a section in an area adjacent to at least one end of the light emitting element ED.

The insulating layer 38 may include materials having insulation property, for example, at least one of the silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). The insulating layer 38 is illustrated as being formed of a single layer, but is not limited thereto. In some embodiments, the insulating layer 38 may be formed in a multi-layered structure in which layers are stacked with each other.

The insulating layer 38 may serve to protect the semiconductor layers and the electrode layer of the light emitting element ED. The insulating layer 38 may prevent an electrical short that may occur in the light emitting layer 36 in case that the light emitting element ED directly contacts an electrode to which an electrical signal is transferred. Also, the insulating layer 38 may prevent light emitting efficiency of the light emitting element ED from being deteriorated.

An outer surface of the insulating layer 38 may be surface-treated. The light emitting element ED may be aligned by being sprayed onto the electrode in a state that it is dispersed in an ink. The surface of the insulating layer 38 may be hydrophobic-treated or hydrophilic-treated, so that the light emitting element ED may be maintained to be dispersed in the ink without being condensed with another light emitting element ED adjacent thereto.

Hereinafter, other embodiments of the display device 10 will be described with reference to other drawings.

Figure 11:
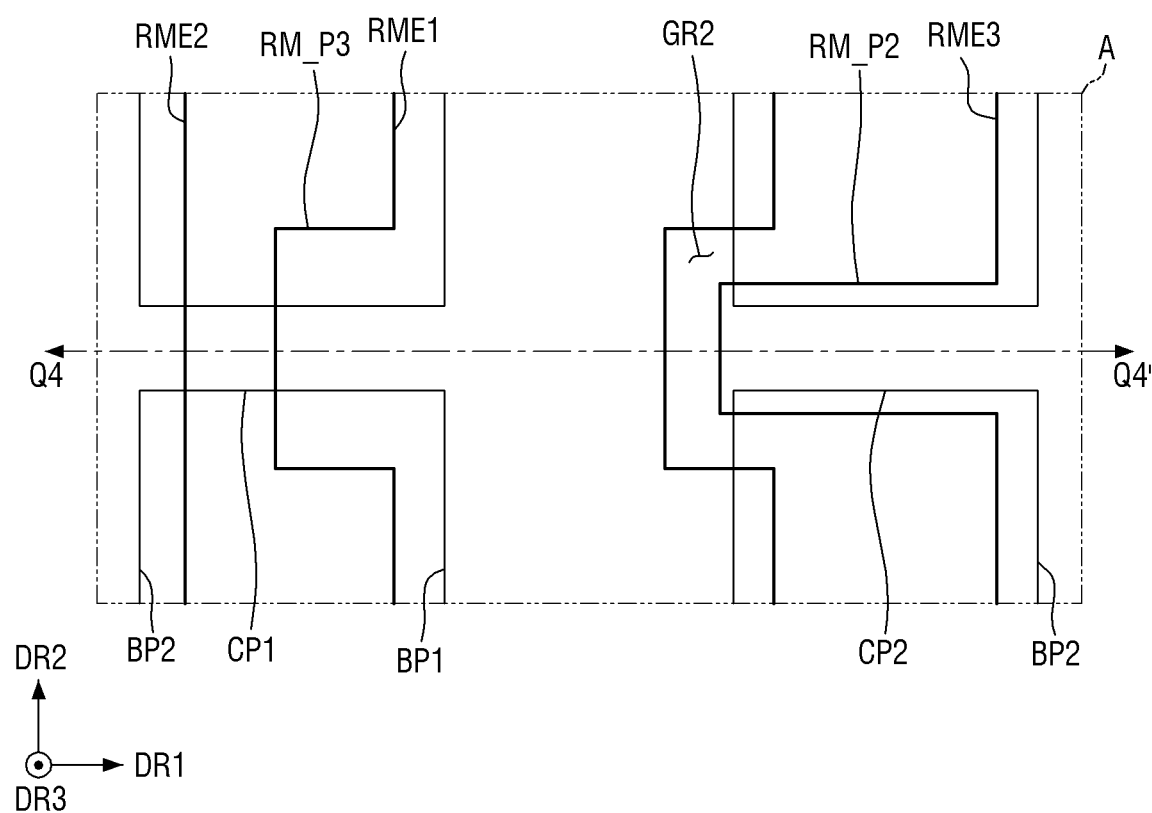
FIG. 11 is a schematic plan view illustrating a portion of a subpixel of a display device according to another embodiment.
Figure 12:
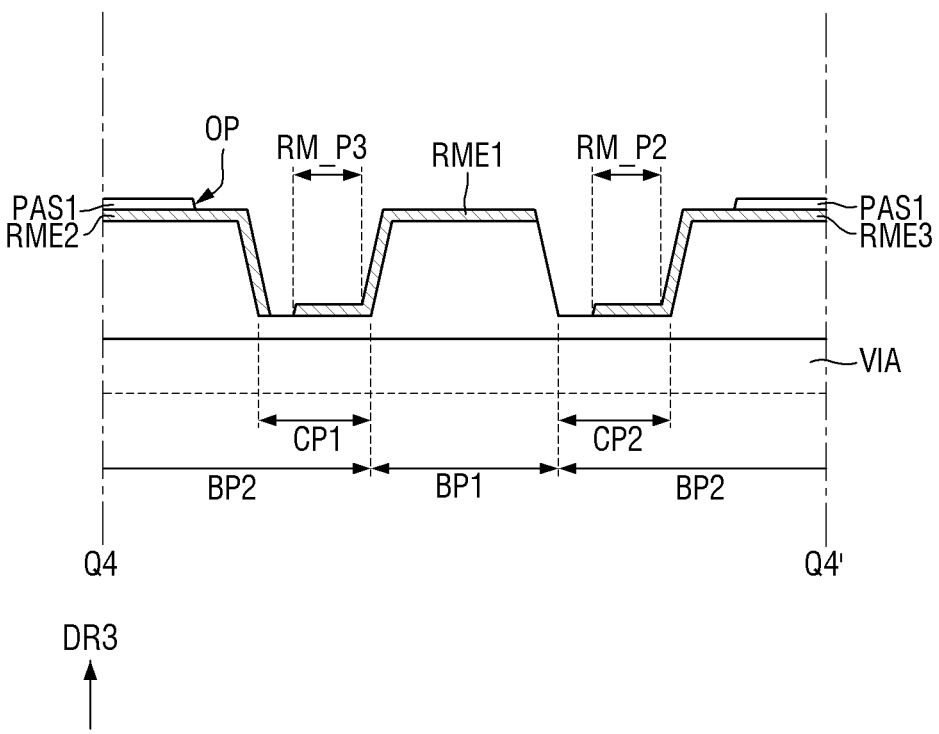
FIG. 12 is a schematic cross-sectional view taken along line Q4-Q4' of FIG. 11.
Figure 13:
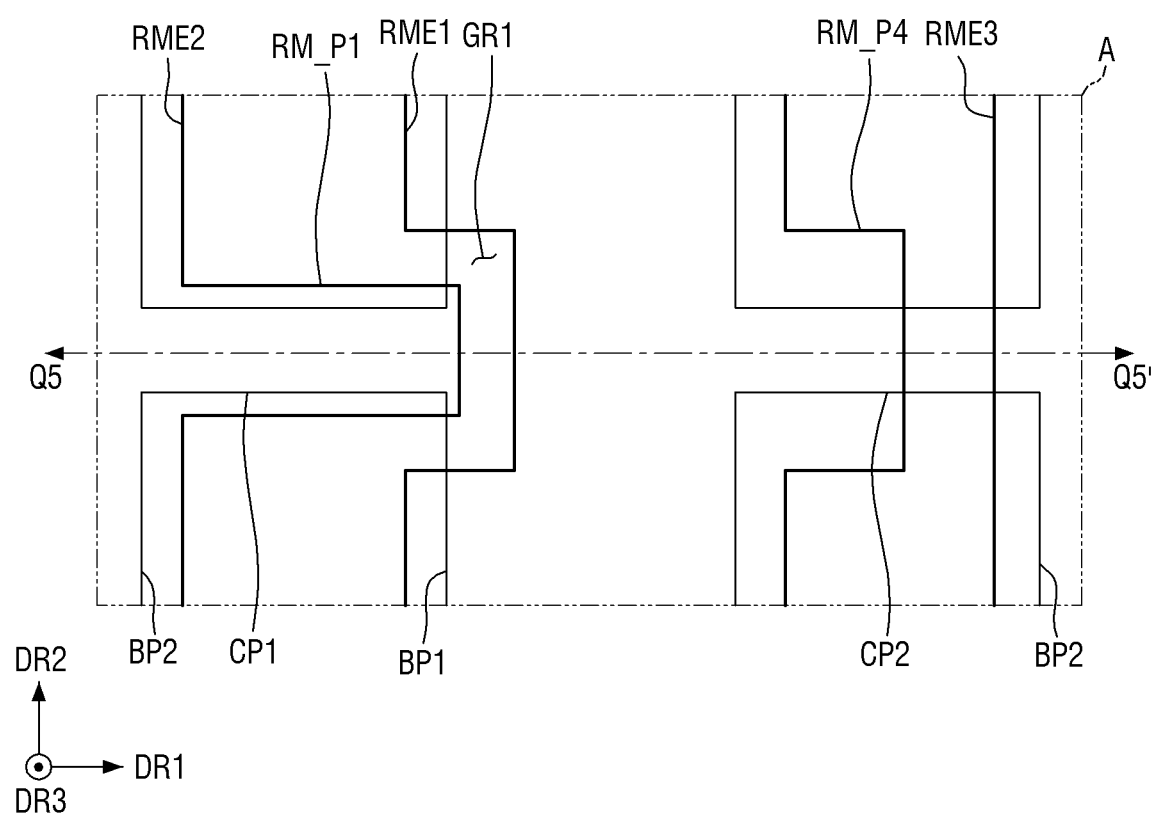
FIG. 13 is a schematic plan view illustrating a portion of a subpixel of a display device according to another embodiment.
Figure 14:
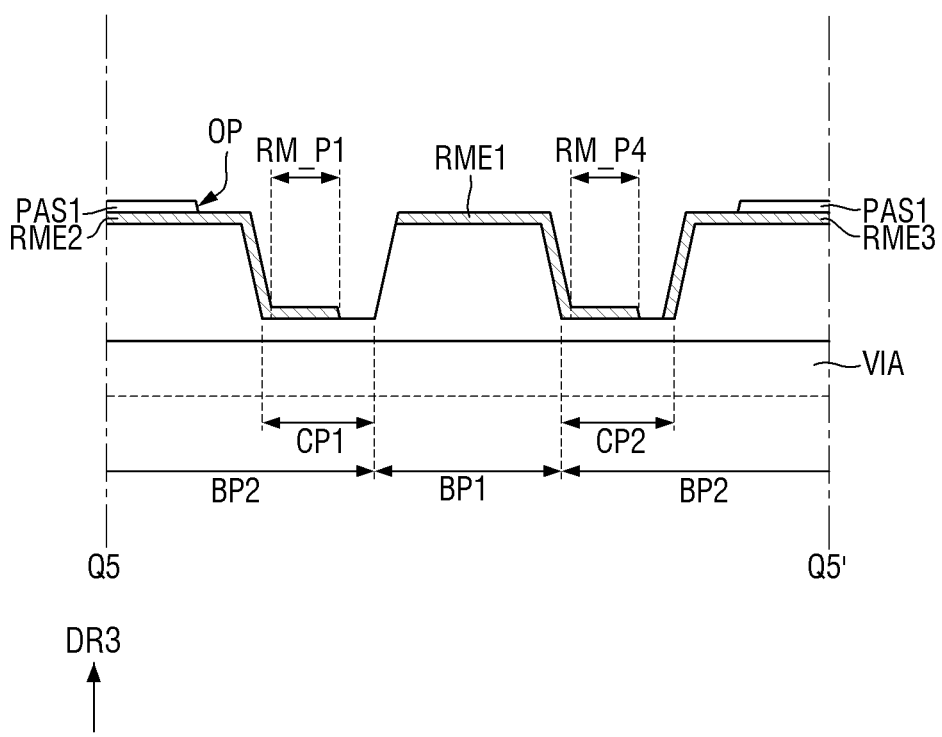
FIG. 14 is a schematic cross-sectional view taken along line Q5-Q5' of FIG. 13.
Figure 15:
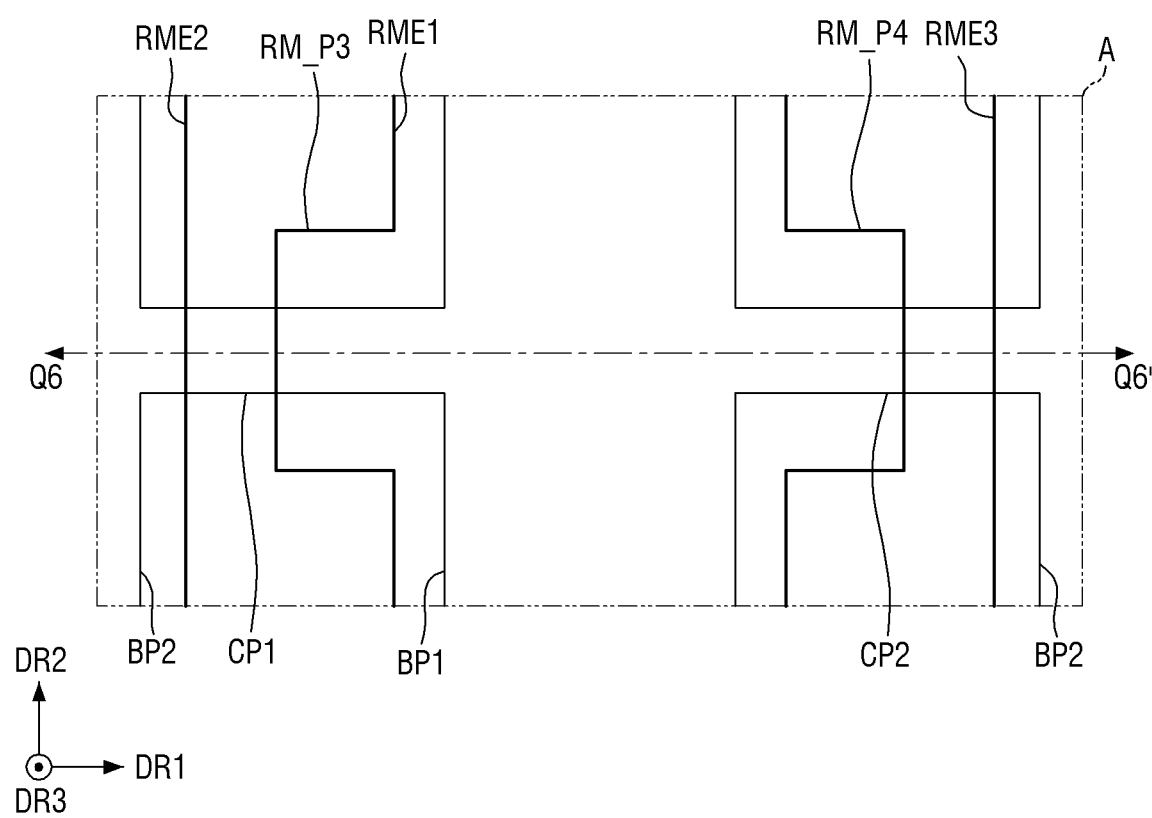
FIG. 15 is a schematic plan view illustrating a portion of a subpixel of a display device according to another embodiment.
Figure 16:
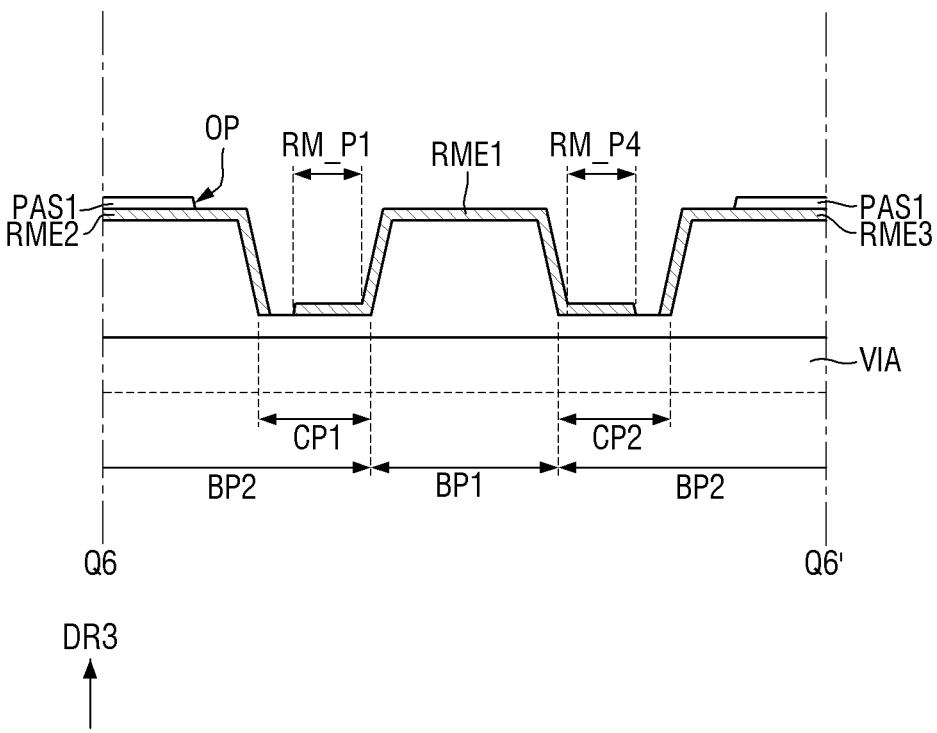
FIG. 16 is a schematic cross-sectional view taken along line Q6-Q6' of FIG. 15.

FIG. 11 is a schematic plan view illustrating a portion of a subpixel of a display device according to another embodiment. FIG. 12 is a schematic cross-sectional view taken along line Q4-Q4' of FIG. 11. FIG. 13 is a schematic plan view illustrating a portion of a subpixel of a display device according to another embodiment. FIG. 14 is a schematic cross-sectional view taken along line Q5-Q5' of FIG. 13. FIG. 15 is a schematic plan view illustrating a portion of a subpixel of a display device according to further embodiment. FIG. 16 is a schematic cross-sectional view taken along line Q6-Q6' of FIG. 15. FIGS. 11, 13, and 15 illustrate other examples of area A of FIG. 4.

Referring to FIGS. 11 and 12, the embodiment may be different from the above-described embodiments of FIGS. 3 to 9 at least in that the first protrusion RM_P1 of the second electrode RME2 is omitted, and a third protrusion RM_P3 may be disposed instead of the first concave portion GR1 of the first electrode RME1. Hereinafter, the description repeated with the above-described embodiments will be omitted, and the following description will be based on a difference from the above-described embodiments.

The first electrode RME1 may include a third protrusion RM_P3 disposed on a side facing the second electrode RME2. The third protrusion RM_P3 may be protruded from a side of the first electrode RME1 opposite to the second electrode RME2 toward the second electrode RME2, and may be protruded in the opposite direction of the first direction DR1. The third protrusion RM_P3 may be spaced apart from the second electrode RME2 in the first direction DR1. The third protrusion RM_P3 may be disposed to overlap the first connection portion CP1 that connects the first bank pattern BP1 with the second bank pattern BP2. A width of the third protrusion RM_P3 in the second direction DR2 may be greater than a width of the first connection portion CP1 in the second direction DR2, and may cover sides of the first connection portion CP1 in the second direction DR2. The second electrode RME2 may be disposed such that a side facing the first electrode RME1 is extended to be parallel with the second direction DR2.

In the embodiment, unlike the embodiments of FIGS. 3 to 9, the first electrode RME1 may be provided with a third protrusion RM_P3 protruded toward the second electrode RME2, so that the electrodes RME may be formed to be generally exposed in the opening OP of the first insulating layer PAS1. Therefore, coating of the ink on the center of the light emission area EMA may be minimized, whereby the light emitting elements for not emitting light may be reduced.

Referring to FIGS. 13 and 14, the embodiment may be different from the above-described embodiments of FIGS. 3 to 9 at least in that the second protrusion RM_P2 of the third electrode RME3 is omitted, and a fourth protrusion RM_P4 may be disposed instead of the second concave portion GR2 of the first electrode RME1. Hereinafter, the description repeated with the above-described embodiments will be omitted, and the following description will be based on a difference from the above-described embodiments.

The first electrode RME1 may include a fourth protrusion RM_P4 disposed on a side facing the third electrode RME3. The fourth protrusion RM_P4 may be protruded from a side of the first electrode RME1 facing the third electrode RME3 toward the third electrode RME3, and may be protruded in the first direction DR1. The fourth protrusion RM_P4 may be spaced apart from the third electrode RME3 in the first direction DR1. The fourth protrusion RM_P4 may be disposed to overlap the second connection portion CP2 that connects the first bank pattern BP1 with the second bank pattern BP2. A width of the fourth protrusion RM_P4 in the second direction DR2 may be greater than a width of the second connection portion CP2 in the second direction DR2, and may cover sides of the second connection portion CP2 in the second direction DR2. The third electrode RME3 may be disposed such that a side facing the first electrode RME1 is extended to be parallel with the second direction DR2.

In the embodiment, unlike the embodiments of FIGS. 3 to 9, the first electrode RME1 may be provided with a fourth protrusion RM_P4 protruded toward the third electrode RME3, so that the electrodes RME may be formed to be generally exposed in the opening OP of the first insulating layer PAS1. Therefore, coating of the ink on the center of the light emission area EMA may be minimized, whereby the light emitting elements for not emitting light may be reduced.

Referring to FIGS. 15 and 16, the embodiment may be different from the above-described embodiments of FIGS. 3 to 9 at least in that the first protrusion RM_P1 of the second electrode RME2 and the second protrusion RM_P2 of the third electrode RME3 are omitted, a third protrusion RM_P3 may be disposed instead of the first concave portion GR1 of the first electrode RME1, and a fourth protrusion RM_P4 may be disposed instead of the second concave portion GR2. Hereinafter, the description repeated with the above-described embodiments will be omitted, and the following description will be based on a difference from the above-described embodiments.

The first electrode RME1 may include a third protrusion RM_P3 and a fourth protrusion RM_P4. The third protrusion RM_P3 may be disposed on a side of the first electrode RME1 facing the second electrode RME2. The third protrusion RM_P3 may be protruded from a side of the first electrode RME1 facing the second electrode RME2 toward the second electrode RME2, and may be protruded in the opposite direction of the first direction DR1. The third protrusion RM_P3 may be spaced apart from the second electrode RME2 in the first direction DR1. The third protrusion RM_P3 may be disposed to overlap the first connection portion CP1 that connects the first bank pattern BP1 with the second bank pattern BP2. A width of the third protrusion RM_P3 in the second direction DR2 may be greater than a width of the first connection portion CP1 in the second direction DR2, and may cover sides of the first connection portion CP1 in the second direction DR2.

The fourth protrusion RS_4 may be disposed on a side of the first electrode RME1 opposite to the third electrode RME3. The fourth protrusion RM_P4 may be protruded from a side of the first electrode RME1 facing the third electrode RME3 toward the third electrode RME3, and may be protruded in the first direction DR1. The fourth protrusion RM_P4 may be spaced apart from the third electrode RME3 in the first direction DR1. The fourth protrusion RM_P4 may be disposed to overlap the second connection portion CP2 that connects the first bank pattern BP1 with the second bank pattern BP2. A width of the fourth protrusion RM_P4 in the second direction DR2 may be greater than a width of the second connection portion CP2 in the second direction DR2, and may cover sides (or both sides) of the second connection portion CP2 in the second direction DR2. The third electrode RME3 may be disposed such that a side facing the first electrode RME1 is extended to be parallel with the second direction DR2.

The second electrode RME2 may be disposed such that a side facing the first electrode RME1 is extended to be parallel with the second direction DR2. The third electrode RME3 may be disposed such that a side facing the first electrode RME1 is extended to be parallel with the second direction DR2.

In the embodiment, unlike the embodiments of FIGS. 3 to 9, the first electrode RME1 may be provided with a third protrusion RM_P4 protruded toward the second electrode RME2 and a fourth protrusion RM_P4 protruded toward the third electrode RME3, so that electrodes RME may be formed to be generally exposed in the opening OP of the first insulating layer PAS1. Therefore, coating of the ink on the center of the light emission area EMA may be minimized, whereby the light emitting elements for not emitting light may be reduced.

Figure 17:
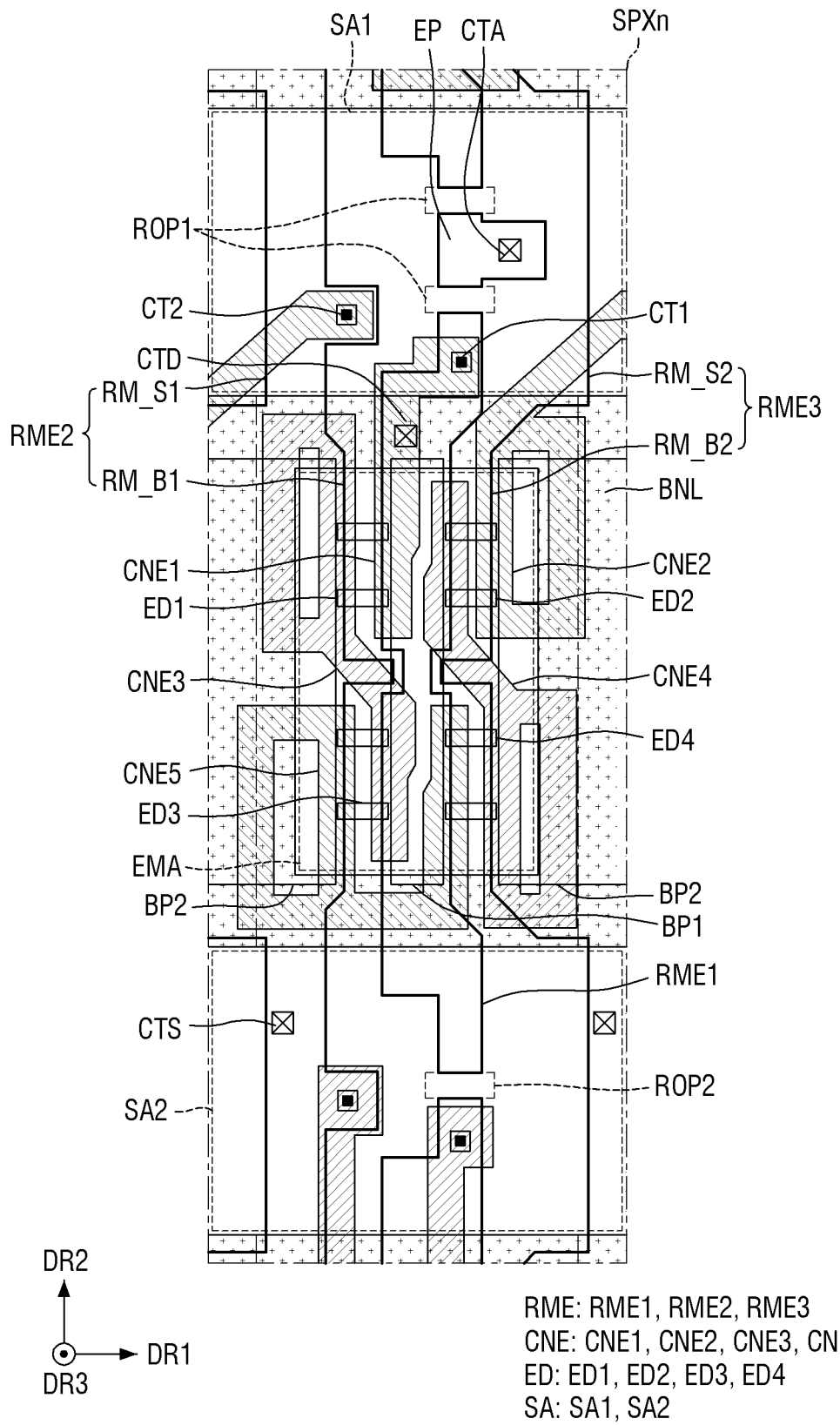
FIG. 17 is a schematic plan view illustrating a subpixel of a display device according to another embodiment.
Figure 18:
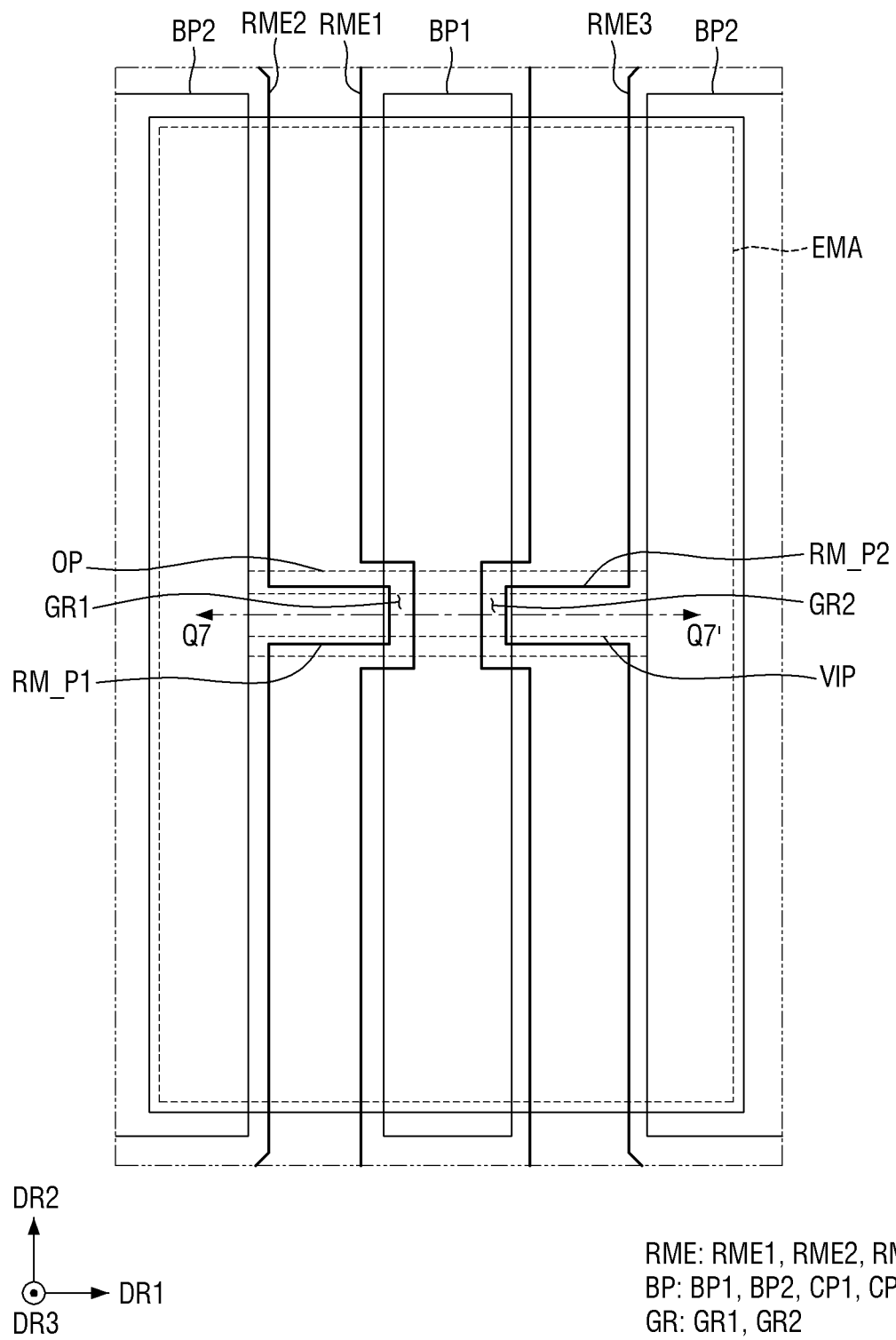
FIG. 18 is a schematic plan view illustrating electrodes and a bank pattern of a subpixel.
Figure 19:
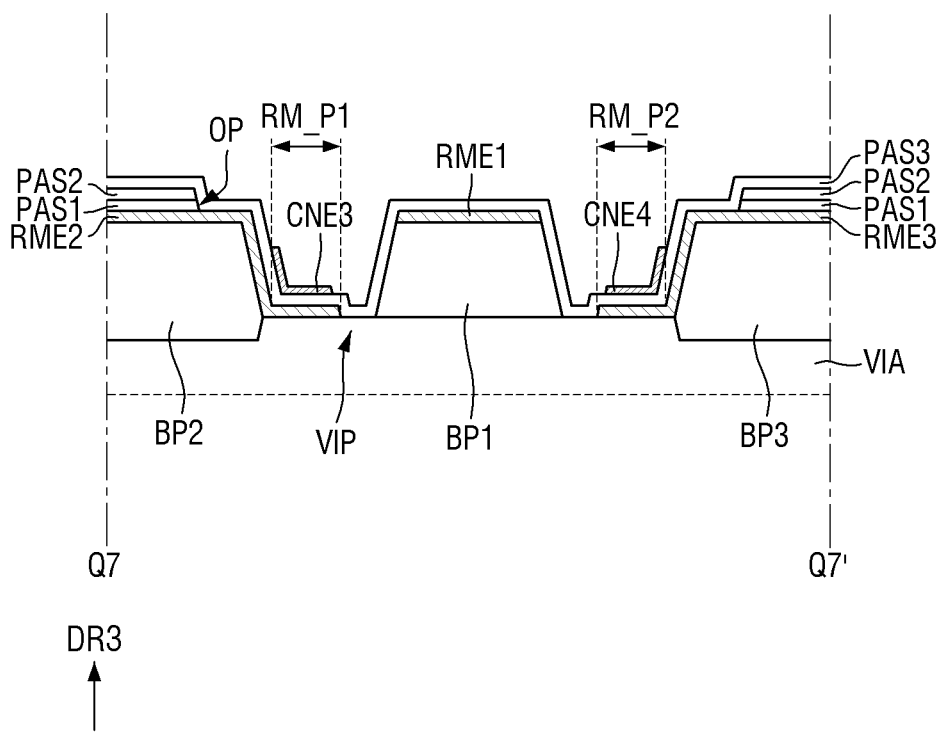
FIG. 19 is a schematic cross-sectional view taken along line Q7-Q7' of FIG. 18.

FIG. 17 is a schematic plan view illustrating a subpixel of a display device according to another embodiment. FIG. 18 is a schematic plan view illustrating electrodes and a bank pattern of a subpixel. FIG. 19 is a schematic cross-sectional view taken along line Q7-Q7' of FIG. 18.

Referring to FIGS. 17 to 19, the embodiment may be different from the above-described embodiments of FIGS. 3 to 9 at least in that the first connection portion CP1 and the second connection portion CP2 of the bank pattern BP are omitted, and a via protrusion VIP may be formed in the via layer VIA to replace the connection portions CP1 and CP2. Hereinafter, the description repeated with the above-described embodiments will be omitted, and the following description will be based on a difference from the above-described embodiments.

Referring to FIGS. 17 to 19, the via layer VIA according to an embodiment may include a via protrusion VIP protruded in the third direction DR3. The via protrusion VIP may be disposed at the center of the subpixel SPXn, and may have an island-shaped pattern extended in the first direction DR1. The via protrusion VIP may overlap the first bank pattern BP1, and may not overlap the second bank pattern BP2. The via protrusion VIP may be disposed between the second bank patterns BP2. The via protrusion VIP may overlap the first protrusion RM_P1 of the second electrode RME2 and the second protrusion RM_P2 of the third electrode RME3, and the via protrusion VIP may be extended to be parallel with these protrusions. The via protrusion VIP may be disposed in an area where a length of the first bank pattern BP1 that is extended in the second direction DR2 is divided into two. A width of the via protrusion VIP in the second direction DR2 may be smaller than a width of the first protrusion RM_P1 or the second protrusion RM_P2 in the second direction DR2.

The via protrusion VIP may be integrally formed with the via layer VIA. The via protrusion VIP may have a thickness (e.g., a predetermined or selectable thickness) in the third direction DR3. The thickness of the via protrusion VIP may be smaller than a thickness of the first bank pattern BP1 and the second bank patterns BP2. For example, the thickness of the via protrusion may be in a range of about 1000 Å to about 5000 Å.

Although FIGS. 17 to 19 show that the via protrusion VIP is disposed in each subpixel SPXn in an island-shaped pattern, the via protrusion VIP is not limited thereto. For example, the via protrusion VIP may have a continuous linear shape extended to subpixels adjacent thereto in the first direction DR1.

In the embodiment, the via protrusion VIP may be formed on the via layer VIA so that a step difference (or height or thickness difference) may be formed in the second electrode RME2 and the third electrode RME3, whereby a height of the second and third electrodes RME2 and RME3 in the opening OP of the first insulating layer PAS1 may be formed to be substantially equal to a height of the first insulating layer PAS1. Therefore, even though the ink in which the light emitting elements ED are dispersed is sprayed into the light emission area EMA, the ink may not be coated on the center of the light emission area EMA, whereby the light emitting elements ED for not emitting light may be minimized. The effective light emitting elements ED may be increased to improve luminance of the subpixel SPXn.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a bank pattern disposed on a substrate and including:
      a first bank pattern extended in a direction;
      second bank patterns adjacent to each other with the first bank pattern disposed between the second bank patterns; and
      connection portions connecting the first bank pattern with the second bank patterns;
   a first electrode disposed on the first bank pattern;
   a second electrode disposed on one of the second bank patterns;
   a third electrode disposed on another one of the second bank patterns;
   an insulating layer disposed on the bank pattern, the first electrode, the second electrode, and the third electrode; and
   light emitting elements disposed between the first electrode and the second electrode, and between the first electrode and the third electrode, wherein
   at least one of the first electrode, the second electrode, and the third electrode includes a protrusion protruded toward an adjacent one of the first electrode, the second electrode, and the third electrode in a plan view, and
   the insulating layer includes an opening exposing the protrusion.

2. The display device of claim 1, wherein
   the connection portions are extended in another direction intersecting the direction, and
   the connection portions are integral with the first bank pattern and the second bank patterns.

3. The display device of claim 1, wherein the connection portions include:
   a first connection portion connecting one of the second bank patterns disposed at a side of the first bank pattern with the first bank pattern; and
   a second connection portion connecting another one the second bank patterns disposed at another side of the first bank pattern with the first bank pattern.

4. The display device of claim 3, wherein
   the first connection portion and the second connection portion are spaced apart from each other with the first bank pattern disposed between the first connection portion and the second connection portion, and
   the first connection portion and the second connection portion are aligned with each other in another direction intersecting the direction.

5. The display device of claim 3, wherein the protrusion includes:
   a first protrusion protruded from the second electrode toward the first electrode; and
   a second protrusion protruded from the third electrode toward the first electrode.

6. The display device of claim 5, wherein
   the first protrusion overlaps the first connection portion in a plan view, and
   the second protrusion overlaps the second connection portion in a plan view.

7. The display device of claim 5, wherein
   the first electrode includes concave portions, and
   the concave portions include:
      a first concave portion corresponding to the first protrusion; and
      a second concave portion corresponding to the second protrusion.

8. The display device of claim 7, wherein
   an end of the first protrusion is disposed in the first concave portion in a plan view, and
   an end of the second protrusion is disposed in the second concave portion in a plan view.

9. The display device of claim 3, wherein the protrusion includes:
   a first protrusion protruded from the first electrode toward the second electrode; and
   a second protrusion protruded from the third electrode toward the first electrode.

10. The display device of claim 9, wherein
the first electrode includes a first concave portion,
the first concave portion corresponds to the second protrusion, and
an end of the second protrusion is disposed in the first concave portion in a plan view.

11. The display device of claim 3, wherein the protrusion includes:
a first protrusion protruded from the first electrode toward the third electrode; and
a second protrusion protruded from the second electrode toward the first electrode.

12. The display device of claim 11, wherein
the first electrode includes a first concave portion,
the first concave portion corresponds to the second protrusion, and
an end of the second protrusion is disposed in the first concave portion in a plan view.

13. The display device of claim 3, wherein the protrusion includes:
a first protrusion protruded from the first electrode toward the second electrode; and
a second protrusion protruded from the first electrode toward the third electrode.

14. A display device comprising:
a bank pattern disposed on a substrate and including:
a first bank pattern extended in a direction; and
second bank patterns adjacent to each other with the first bank pattern disposed between the second bank patterns;
a first electrode disposed on the first bank pattern;
a second electrode disposed on one of the second bank patterns;
a third electrode disposed on another one of the second bank patterns;
an insulating layer disposed on the bank pattern, the first electrode, the second electrode, and the third electrode;
light emitting elements disposed between the first electrode and the second electrode, and between the first electrode and the third electrode; and
a via layer disposed between the substrate and the bank pattern and including a via protrusion protruded through the insulating layer, wherein
at least one of the first electrode, the second electrode, and the third electrode includes a protrusion protruded toward an adjacent one of the first electrode, the second electrode, and the third electrode in a plan view, and
the insulating layer includes an opening exposing the protrusion.

15. The display device of claim 14, wherein
the via protrusion is extended in another direction intersecting the direction, and
the via protrusion is integral with the via layer.

16. The display device of claim 14, wherein
the via protrusion overlaps the protrusion in a plan view, and
the via protrusion and the protrusion are extended to be parallel with each other.

17. The display device of claim 14, wherein
the first electrode includes a concave portion in an area corresponding to the protrusion, and
the opening overlaps the concave portion, the protrusion, and the via protrusion in a plan view.

18. The display device of claim 14, wherein an upper surface of the insulating layer is aligned with and matched with upper surfaces of the second electrode and the third electrode in the opening.

19. The display device of claim 14, further comprising:
a bank layer disposed on the insulating layer, partitioning a light emission area,
wherein the via protrusion, the protrusion, and the opening are disposed in the light emission area.

20. The display device of claim 19, wherein
the light emitting elements include:
a first light emitting element and a second light emitting element which are disposed between the first electrode and the second electrode;
a third light emitting element and a fourth light emitting element which are disposed between the first electrode and the third electrode, and
the display device further includes:
a first connection electrode electrically contacting an end of the first light emitting element;
a second connection electrode electrically contacting another end of the first light emitting element and an end of the second light emitting element;
a third connection electrode electrically contacting another end of the second light emitting element and an end of the third light emitting element;
a fourth connection electrode electrically contacting another end of the third light emitting element and an end of the fourth light emitting element; and
a fifth connection electrode electrically contacting another end of the fourth light emitting element.

* * * * *